(12) United States Patent
Lee et al.

(10) Patent No.: US 8,339,534 B2
(45) Date of Patent: Dec. 25, 2012

(54) DISPLAY DEVICE

(75) Inventors: Jun-Pyo Lee, Asan-si (KR); Sun-Kyu Son, Suwon-si (KR); Ok-Kwon Shin, Cheonan-si (KR); Jung-Won Kim, Seoul (KR); Hee-Jin Choi, Seoul (KR); Sang-Soo Kim, Seoul (KR); Hyong-Rae Lee, Cheonan-si (KR); Duk-Hwan Kang, Incheon (KR); Kwan-Woo Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 819 days.

(21) Appl. No.: 12/510,709

(22) Filed: Jul. 28, 2009

(65) Prior Publication Data

US 2010/0032677 A1 Feb. 11, 2010

Related U.S. Application Data

(63) Continuation-in-part of application No. 12/243,547, filed on Oct. 1, 2008.

(30) Foreign Application Priority Data

Aug. 11, 2008 (KR) .................. 10-2008-0078252

(51) Int. Cl.
*G02F 1/136* (2006.01)
*G02F 1/1343* (2006.01)
*G09G 3/36* (2006.01)
(52) U.S. Cl. ............... 349/48; 349/38; 349/42; 349/43; 345/90; 345/92; 345/93

(58) Field of Classification Search ............. 349/38, 349/42–43, 48; 345/90, 92–93
See application file for complete search history.

(56) References Cited

U.S. PATENT DOCUMENTS

| 6,940,573 | B2 | 9/2005 | Um et al. | |
|---|---|---|---|---|
| 2002/0033907 | A1 | 3/2002 | Oke et al. | |
| 2003/0218586 | A1 | 11/2003 | Wu et al. | |
| 2007/0064164 | A1 | 3/2007 | Tasaka et al. | |
| 2008/0123002 | A1* | 5/2008 | Yeh | 349/37 |
| 2008/0136983 | A1 | 6/2008 | Huang | |
| 2008/0251797 | A1 | 10/2008 | Chang | |

* cited by examiner

*Primary Examiner* — Nathanael R Briggs
(74) *Attorney, Agent, or Firm* — Cantor Colburn LLP

(57) ABSTRACT

A display device includes gate lines; data lines; charge control lines each including a charge control voltage input pad; first and second thin film transistors (TFTs) each including control and input electrodes connected to the gate and data lines, respectively; a first liquid crystal capacitor connected to an output electrode of the first TFT; a second liquid crystal capacitor connected to an output electrode of the second TFT; a charge control TFT including a control electrode and an input electrode connected to one of the charge control lines and the second pixel electrode, respectively; and a charge-down capacitor connected to an output electrode of the charge control TFT. A duration time of a turn-on voltage pulse applied to the charge control TFT is different from a duration time of a turn-on voltage pulse applied to the first TFT transistor or the second TFT.

20 Claims, 17 Drawing Sheets

FIG.5
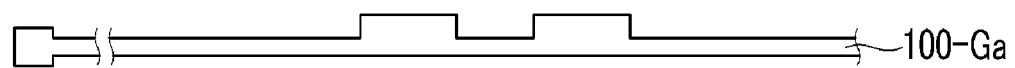
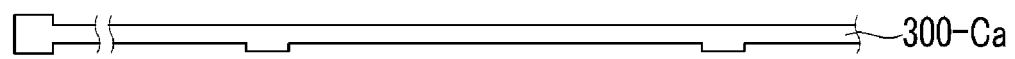
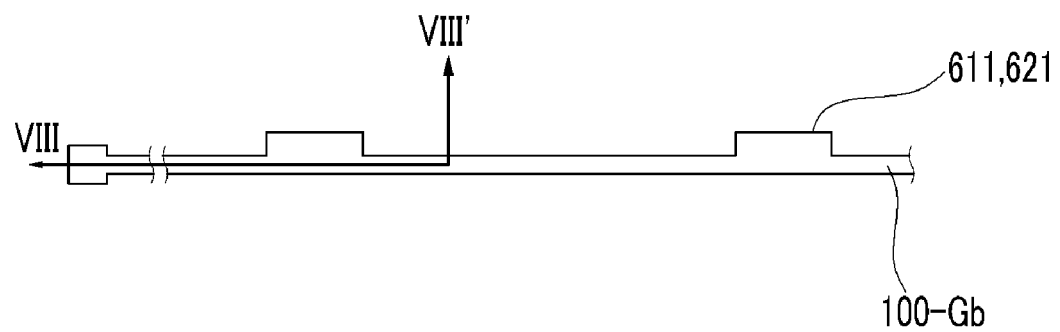
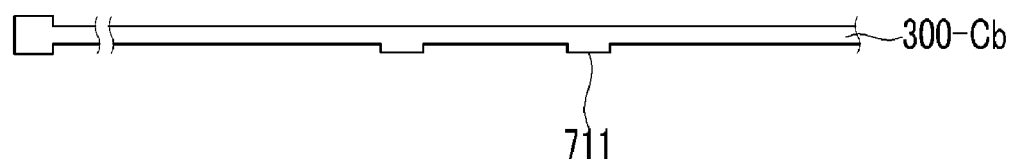

DISPLAY DEVICE

This application is a continuation-in-part application of U.S. application Ser. No. 12/243,547 filed on Oct. 1, 2008, which claims priority to Korean Patent Application No. 10-2008-0078252, filed on Aug. 11, 2008, and all the benefits accruing therefrom under 35 U.S.C. §119, the contents of which in their entirety are herein incorporated reference.

BACKGROUND OF THE INVENTION (a) Field of the Invention

The present invention relates to a display apparatus. More particularly, the present invention relates to a display apparatus having substantially reduced afterimages and significantly improved display quality.

(b) Description of the Related Art

Liquid crystal display ("LCD") devices are being actively developed to improve advantages such as small size, light weight and large screen size relative to other types of display devices, such as cathode ray tubes ("CRTs"), for example. In general, the LCD displays an image using a plurality of unit pixels, each unit pixel thereof including a thin film transistor ("TFT") and a liquid crystal capacitor.

More specifically, the liquid crystal capacitor typically includes a pixel electrode, a common electrode and a liquid crystal layer disposed therebetween. In operation of the LCD, an electric field is developed between the pixel electrode and the common electrode by supplying external charges, e.g., a gradation signal, to the pixel electrode though the TFT. Changing the electric field changes an orientation of liquid crystal molecules in the liquid crystal layer, and a quantity of light transmitted through the liquid crystal layer is thereby changed to display a desired image. However, the LCD of the prior art suffers from poor visibility due to afterimages, for example, caused by inherent characteristics of the liquid crystal molecules.

Resolution of the LCD is proportional to a number of the unit pixels provided in a unit area. More particularly, as the number of the unit pixels per unit area increases, the resolution increases. However, as the resolution increases, a number of required scanning lines, e.g., gate lines, increases, and a time available to charge the external charges, e.g., the gradation signal, into one pixel electrode is thereby decreased, further hampering the conventional LCD of the prior art in displaying the desired image.

BRIEF SUMMARY OF THE INVENTION

A display device according to an exemplary embodiment of the present invention includes: gate lines extending along a first direction; data lines extending along a second direction and intersecting the gate lines; charge control lines extending along the first direction and each including a charge control voltage input pad disposed at an end thereof; a first thin film transistor and a second thin film transistor each including a control electrode and an input electrode connected to one of the gate lines and one of the data lines, respectively; a first liquid crystal capacitor connected to an output electrode of the first thin film transistor; a second liquid crystal capacitor connected to an output electrode of the second thin film transistor; a charge control thin film transistor including a control electrode and an input electrode connected to one of the charge control lines and the second pixel electrode, respectively; and a charge-down capacitor connected to an output electrode of the charge control thin film transistor. A duration time of a turn-on voltage pulse applied to the charge control thin film transistor is different from a duration time of a turn-on voltage pulse applied to the first thin film transistor and/or the second thin film transistor.

The duration time of the turn-on voltage pulse applied to the charge control thin film transistor may be less than the duration time of the turn-on voltage pulse applied to the first thin film transistor and/or the second thin film transistor.

The display device may further include pixels arranged in a matrix including pixel rows. The pixels include the first liquid crystal capacitor, the second liquid crystal capacitor, the charge-down capacitor, the first thin film transistor, the second thin film transistor and the charge control thin film transistor. In an exemplary embodiment, the data lines may include a first data line and a second data line, and the gate lines may include a first gate line connected to the pixels of an odd-numbered pixel row and a second gate line connected to the pixels of an even-numbered pixel row. The first gate line and the second gate line may be supplied with a same gate voltage.

In an exemplary embodiment, the pixels of the odd-numbered pixel row are connected to one data line of the first data line and the second data line, e.g., to either the first data line or the second data line, while the pixels of the even-numbered unit pixel row are connected to another data line not connected to the pixels of the odd-numbered pixel row, e.g., to the other data line of either the first data line or the second data line to which the pixels of the odd-numbered pixel row are connected.

The charge control lines may include a first charge control line connected to the pixels of the odd-numbered pixel row and a second charge control line connected to the pixels of the even-numbered pixel row. In addition, the first charge control line and the second charge control line may be supplied with a same charge control turn-on voltage.

A storage electrode line extending along the first direction may be further included, and the storage electrode line may include a protrusion overlapping at least a portion of charge control electrode of the charge down capacitor.

An exemplary embodiment further includes a signal controller which applies a first clock signal for generating a turn-on voltage pulse to the charge control thin film transistor. The first clock signal is different from a second clock signal for generating a turn-on voltage pulse applied to the first thin film transistor and/or the second thin film transistor.

A display device according to an alternative exemplary embodiment of the present invention includes: gate lines extending along a first direction; data lines extending along a second direction and intersecting the gate lines; charge control lines extending along the first direction and each including a charge control voltage input pad disposed at an end thereof; a first thin film transistor and a second thin film transistor each including a control electrode and an input electrode connected to one of the gate lines and one of the data lines, respectively; a first liquid crystal capacitor connected to an output electrode of the first thin film transistor; a second liquid crystal capacitor connected to an output electrode of the second thin film transistor; a charge control thin film transistor including a control electrode and an input electrode connected to one of the charge control lines and the second pixel electrode, respectively; and a charge-down capacitor connected to an output electrode of the charge control thin film transistor. A magnitude of a turn-on voltage applied to the charge control thin film transistor is different from a magnitude of the turn-on voltage applied to the first thin film transistor and/or the second thin film transistor.

The magnitude of the turn-on voltage applied to the charge control thin film transistor may be less than the magnitude of the turn-on voltage applied to the first thin film transistor and/or the second thin film transistor.

The display device may further include pixels arranged in a matrix including pixel rows, and the pixels may include the first liquid crystal capacitor, the second liquid crystal capacitor, the charge-down capacitor, the first thin film transistor, the second thin film transistor and the charge control thin film transistor. In addition, the data lines may include a first data line and a second data line, and the gate lines may include a first gate line connected to the pixels of an odd-numbered pixel row and a second gate line connected to the pixels of an even-numbered pixel row. In an exemplary embodiment, the first gate line and the second gate line may be supplied with a same gate voltage.

The pixels of the odd-numbered pixel row may be connected to one data line of the first data line and the second data line, e.g., to either the first data line or the second data line, while the pixels of the even-numbered unit pixel row may be connected to another data line not connected to the pixels of the odd-numbered pixel row, e.g., to the other data line of either the first data line or the second data line to which the pixels of the odd-numbered pixel row are connected.

The charge control lines may include a first charge control line connected to the pixels of the odd-numbered pixel row and a second charge control line connected to the pixels of the even-numbered pixel row. Additionally, the first charge control line and the second charge control line may be supplied with a same charge control turn-on voltage.

A storage electrode line extending along the first direction may be further included, and the storage electrode line may include a protrusion overlapping at least a portion of a charge control electrode of the charge down capacitor.

In an exemplary embodiment, the turn-on voltage applied to the charge control thin film transistor may be generated by dividing the turn-on voltage applied to the first thin film transistor and/or the second thin film transistor.

A display device according to another alternative exemplary embodiment of the present invention includes: gate lines extending along a first direction; data lines extending along a second direction and intersecting the gate lines; charge control lines extending along the first direction and each including a charge control voltage input pad disposed at an end thereof; a first thin film transistor and a second thin film transistor each including a control electrode and an input electrode connected to one of the gate lines and one of the data lines, respectively; a first liquid crystal capacitor connected to an output electrode of the first thin film transistor; a second liquid crystal capacitor connected to an output electrode of the second thin film transistor; a charge control thin film transistor including a control electrode and an input electrode connected to the charge control line and the second pixel electrode, respectively; and a charge-down capacitor connected to an output electrode of the charge control thin film transistor. A thickness of an insulating layer disposed between the control electrode and semiconductor of the charge control thin film transistor is different from a thickness of an insulating layer disposed between the control electrode and a semiconductor of the first thin film transistor and/or the second thin film transistor.

The thickness of the insulating layer disposed between the control electrode and the semiconductor of the charge control thin film transistor may be greater than the thickness of the insulating layer disposed between the control electrode and the semiconductor of the first thin film transistor and the second thin film transistor by a value greater than or equal to about 1000 angstroms (Å).

The display device according to an exemplary embodiment may further include pixels arranged in a matrix including pixel rows, and the pixels may include the first liquid crystal capacitor, the second liquid crystal capacitor, the charge-down capacitor, the first thin film transistor, the second thin film transistor and the charge control thin film transistor. In addition, the data lines may include a first data line and a second data line, and the gate lines may include a first gate line connected to the pixels of an odd-numbered pixel row and a second gate line connected to the pixels of an even-numbered pixel row. In an exemplary embodiment, the first gate line and the second gate line may be supplied with a same gate voltage.

The pixels of the odd-numbered pixel row may be connected to one data line of the first data line and the second data line, e.g., to either the first data line or the second data line, while the pixels of the even-numbered unit pixel row may be connected to another data line not connected to the pixels of the odd-numbered pixel row, e.g., to the other data line of either the first data line or the second data line to which the pixels of the odd-numbered pixel row are connected to.

The charge control lines may include a first charge control line connected to the pixels of the odd-numbered pixel row and a second charge control line connected to the pixels of the even-numbered pixel row. Moreover, the first charge control line and the second charge control line may be supplied with a same charge control turn-on voltage.

A storage electrode line extending along the first direction may be further included, and the storage electrode line may include a protrusion overlapping at least a portion of a charge control electrode of the charge down capacitor.

BRIEF DESCRIPTION OF THE DRAWINGS

The above and other aspects, features and advantages of the present invention will become more readily apparent by describing in further detail exemplary embodiments thereof with reference to the accompanying drawings, in which:

FIGS. 5 through 7 are plan views illustrating steps of a method of fabricating a thin film transistor ("TFT") substrate according to an exemplary embodiment of the present invention;

DETAILED DESCRIPTION OF THE INVENTION

Figure 1:
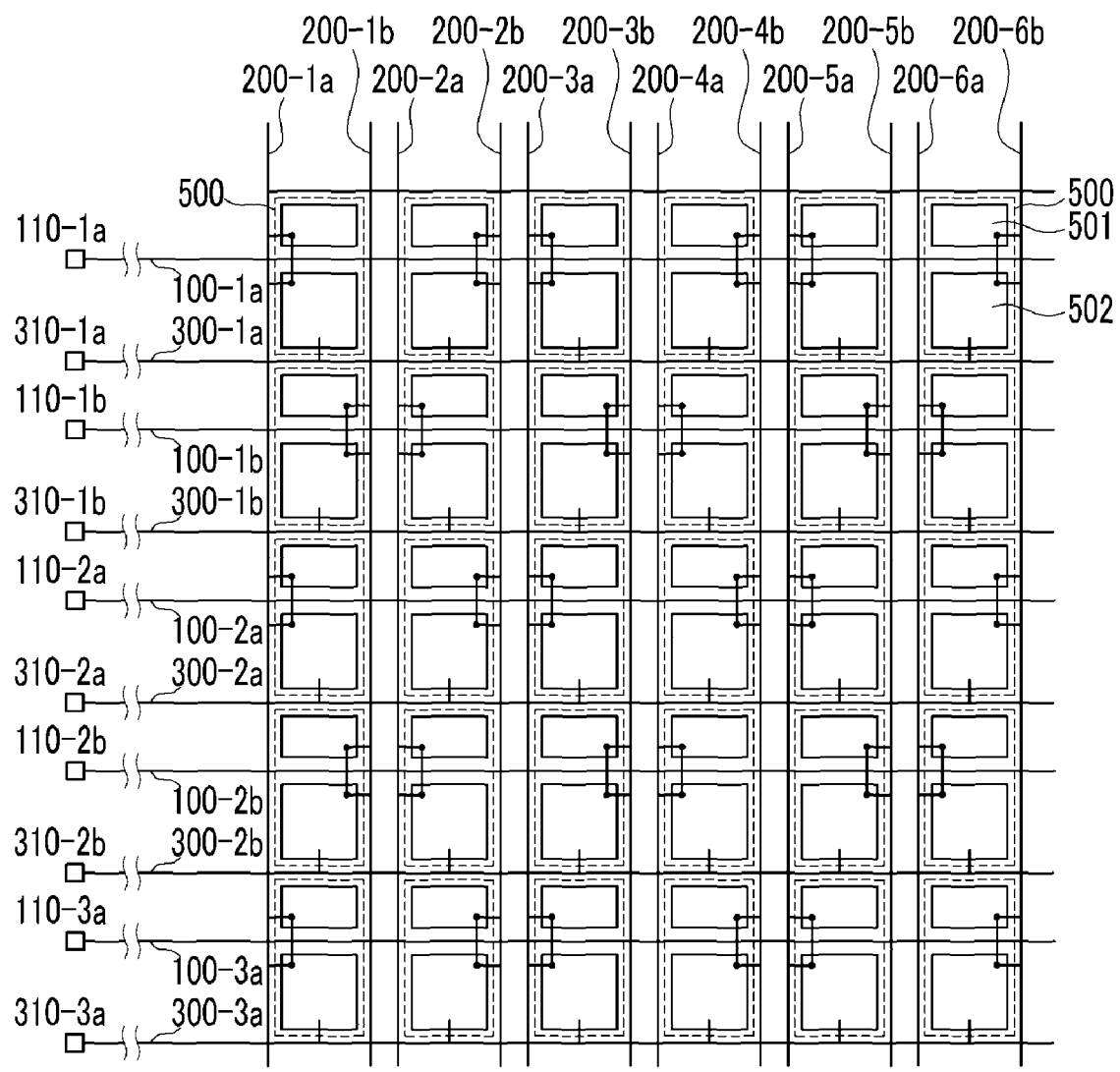
FIG. 1 is a schematic plan view of a display device according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

Figure 2:
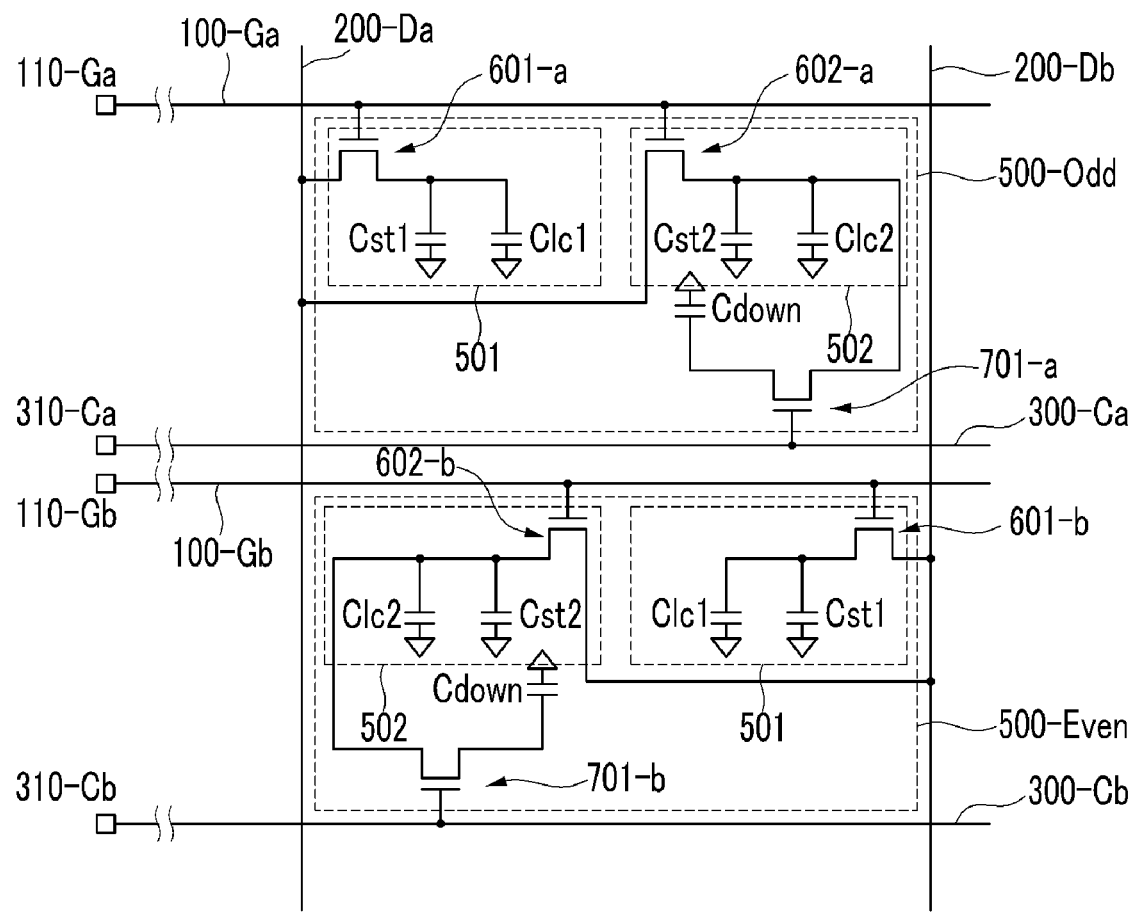
FIG. 2 is a schematic circuit diagram of the display device according to the exemplary embodiment of the present invention shown in FIG. 1.

FIG. 1 is a schematic plan view of a display device according to an exemplary embodiment of the present invention, and FIG. 2 is a schematic circuit diagram of the display device according to the exemplary embodiment of the present invention shown in FIG. 1.

Referring to FIG. 1, the display device according to an exemplary embodiment of the present invention includes unit pixels 500 disposed in a substantially matrix pattern, a plurality of gate lines, e.g., gate lines 100-1a, 100-2a, 100-3a, 100-1b, and 100-2b, a plurality of first data lines, e.g., first data lines 200-1a, 200-2a, 200-3a, 200-4a, 200-5a and 200-6a, a plurality of second data lines, e.g., second data lines 200-1b, 200-2b, 200-3b, 200-4b, 200-5b and 200-6b, and a plurality of charge control lines, e.g., charge control lines 300-1a, 300-2a, 300-3a, 300-1b, 300-2b and 300-3b. The display device according to an exemplary embodiment of the present invention further includes gate voltage input pads 110-1a, 110-1b, 110-2a, 110-2b and 110-3a, as well as charge control gate voltage input pads, e.g., charge control input pads 310-1a, 310-1b, 310-2a, 310-2b and 310-3a, as shown in FIG. 1.

As shown in FIG. 1, the matrix (hereinafter referred to as a "pixel matrix") includes a plurality of the unit pixels 500. Specifically the pixel matrix includes pixel columns aligned in a first direction, e.g., a column direction, and a pixel rows aligned in a second direction, e.g., a row direction substantially perpendicular to the first direction. In an exemplary embodiment, the unit pixels 500 emit red, green and blue light and are sequentially arranged in the pixel row direction, but alternative exemplary embodiments of the present invention are not limited thereto. For example, in an alternative exemplary embodiment, the unit pixels 500 which emit red, green and blue light may be sequentially arranged in the pixel column direction.

Two unit pixels 500 of the plurality of unit pixels 500 will now be described in further detail with reference to FIG. 2. More specifically, in FIG. 2, an odd-numbered pixel 500-Odd connected to the data line 200-1*a* (FIG. 1), hereinafter referred to, for purposes of convenient description, as a "first data line 200-Da" or a "left-hand data line 200-Da" and an even-numbered pixel 500-Even is connected to the data line 200-1*b* (FIG. 1), hereinafter referred to as a "second data line 200-Db" or a "right-hand data line 200-Db". In addition, the odd-numbered unit pixel 500-Odd and the even-numbered unit pixel 500-Even each includes a first sub pixel 501 and a second sub pixel 502, but alternative exemplary embodiments are not limited thereto. Alternatively, for example, more than two sub pixels may be provided in each of odd-numbered unit pixel 500-Odd and the even-numbered unit pixel 500-Even. In addition, it will be understood that, for purposes of illustration, only two unit pixels 500 are shown in FIG. 2, but exemplary embodiments are not limited thereto. Instead exemplary embodiments of the present invention include additional columns and/or rows of unit-pixels, alternately labeled even and odd, as shown in FIG. 1.

Still referring to FIG. 2, the first sub pixel 501 of the odd-numbered pixel 500-odd includes a first thin film transistor ("TFT") 601-*a*, a first liquid crystal capacitor Clc1 and a first storage capacitor Cst1. A gate terminal, e.g. a gate electrode, of the first TFT 601-*a* is connected to the gate line 100-1*a* (FIG. 1), hereinafter referred to as a "first gate line 100-Ga".

In addition, a source terminal of the first thin film transistor 601-*a* is connected to the first data line 200-Da. A drain terminal of the first thin film transistor 601-*a* is connected to the first liquid crystal capacitor Clc1 and the first storage capacitor Cst1, as shown in FIG. 2.

The first sub pixel 501 of the even-numbered pixel 500-Even includes a first TFT 601-*b*, a first liquid crystal capacitor Clc1 and a first storage capacitor Cst1. A gate terminal of the first TFT 601-*b* is connected to the gate line 100-1*b* (FIG. 1), hereinafter referred to as a "second gate line 100-Gb".

A source terminal of the first TFT 601-*b* is connected to the second data line 200-Db. A drain terminal of the first thin film transistor 601-*b* is connected to it's the first liquid crystal capacitor Clc1 and the first storage capacitor Cst1 of the first sub pixel 501 of the even-numbered unit pixel 500-Even, as shown in FIG. 2.

The second sub pixel 502 of the odd-numbered pixel 500-Odd includes a second TFT 602-*a*, a charge control transistor 701-*a*, a second liquid crystal capacitor Clc2, a second storage capacitor Cst2 and a charge down capacitor Cdown. A gate terminal of the second TFT 602-*a* is connected to the first gate line 100-Ga. A source terminal of the second TFT 602-*a* is connected to the first data line 200-Da. A drain terminal of the first TFT 602-*a* is connected to the second liquid crystal capacitor Clc2 and the second storage capacitor Cst2. A gate terminal of the charge control transistor 701-*a* is connected to the charge control line 300-1*a* (FIG. 1), hereinafter referred to as a "first charge control line 300-Ca". A source terminal of the charge control transistor 701-*a* is connected to the second liquid crystal capacitor Clc2 and it's a drain terminal thereof is connected to the charge down capacitor Cdown, as shown in FIG. 2.

The second sub pixel 502 of the even-numbered pixel 500-Even includes a second TFT 602-*b*, a charge control transistor 701-*b*, a second liquid crystal capacitor Clc2, a second storage capacitor Cst2 and a charge down capacitor Cdown. A gate terminal of the second TFT 602-*b* is connected to the second gate line 100-Gb. A source terminal of the second TFT 602-*b* is connected to the second data line 200-Db. A drain terminal of the second TFT 602-*b* is connected to the second liquid crystal capacitor Clc2 and the second storage capacitor Cst2. A gate terminal of the charge control transistor 701-*b* is connected to the charge control line 300-1*b* (FIG. 1), hereinafter referred to as a "second charge control line 300-Cb". A source terminal of the charge control transistor 701-*b* is connected to the second liquid crystal capacitor Clc2 and it's a drain terminal thereof is connected to the charge down capacitor Cdown, as shown in FIG. 2.

In an alternative exemplary embodiment of the present invention, the odd-numbered unit pixel 500-Odd and the even-numbered unit pixel 500-Even may each further include a charge-up capacitor (not shown). In this case, the drain terminals of each of the charge control transistor 701-1 and the charge control transistor 701-*b*, respectively, may be connected to a first electrode of the charge-up capacitor Cup. A second electrode of the charge-up capacitor Cup may be connected to the drain terminals of each of the first TFT 601-*a* and the first TFT 601-*b*, respectively.

Referring again to FIG. 1, the gate lines 100-1*a*, 100-2*a* and 100-3*a*, 100-1*b*, 100-2*b* and 100-3*b* extend substantially in the row direction of the pixel matrix. In addition, the gate lines 100-1*a*, 100-2*a*, 100-3*a*, 100-1*b*, 100-2*b* and 100-3*b* are connected to corresponding unit pixels 500 in pixel rows of the pixel matrix. More specifically, one of the gate lines 100-1*a*, 100-2*a* and 100-3*a*, 100-1*b*, 100-2*b* and 100-3*b* is connected to a corresponding one of the pixel rows. As a result, each of the gate lines 100-1*a*, 100-2*a* and 100-3*a*, 100-1*b*, 100-2*b* and 100-3*b* is disposed to pass through a unit pixel region, as illustrated in FIG. 1. More specifically, each of the gate lines 100-1*a*, 100-2*a*, 100-3*a*, 100-1*b*, 100-2*b* and 100-3*b* overlaps at least a portion of each of the unit pixel regions, but alternative exemplary embodiments are not limited thereto. Alternatively, for example, each of the gate lines 100-1*a*, 100-2*a* and 100-3*a*, 100-1*b*, 100-2*b* and 100-3*b* may extend along an outer periphery of each of the unit pixel regions.

Still referring to FIG. 1, the data lines 200-1*a*, 200-2*a*, 200-3*a*, 200-4*a*, 200-5*a*, 200-6*a*, 200-1*b*, 200-2*b*, 200-3*b*, 200-4*b*, 200-5*b* and 200-6*b* extend substantially in the column direction of the pixel matrix. Further, the data lines 200-1*a*, 200-2*a*, 200-3*a*, 200-4*a*, 200-5*a*, 200-6*a*, 200-1*b*, 200-2*b*, 200-3*b*, 200-4*b*, 200-5*b* and 200-6*b* are connected to associated pixel columns of the pixel matrix. Specifically, two data lines are both connected to a given pixel column. More specifically, one of the first data lines 200-1*a*, 200-2*a*, 200-3*a*, 200-4*a*, 200-5*a* and 200-6*a* is connected to a given pixel column, while one of the second data lines 200-1*b*, 200-2*b*, 200-3*b*, 200-4*b*, 200-5*b* and 200-6*b* is also connected to the given pixel column. For example, as best shown in FIG. 2, the first data line 200-Da (e.g., the left-hand data line 200-Da, corresponding to the data line 200-1*a* of FIG. 1) and the second data line 200-Db (e.g., the right-hand data line 200-Db corresponding to the data line 200-1*b* of FIG. 1) are both connected to unit pixels 500 in the pixel column including the odd-numbered unit pixel 500-Odd and the even-numbered pixel column 500-Even, as shown in FIG. 2

Thus, as illustrated in FIG. 1 and in the context of the more detailed description above with reference to FIG. 2, in an exemplary embodiment of the present invention, one first data line 200-1a, 200-2a, 200-3a, 200-4a, 200-5a and 200-6a of a plurality of first data lines 200-1a, 200-2a, 200-3a, 200-4a, 200-5a and 200-6a is disposed at a left side of a corresponding pixel column, while one second data line 200-1b, 200-2b, 200-3b, 200-4b, 200-5b and 200-6b of a plurality of second data lines 200-1b, 200-2b, 200-3b, 200-4b, 200-5b and 200-6b is disposed at an opposite right side of the corresponding pixel column. Further, Odd-numbered unit pixels 500 in the corresponding pixel column are connected to the first data lines 200-1a, 200-2a, 200-3a, 200-4a, 200-5a and 200-6a or, alternatively, to the second data lines 200-1b, 200-2b, 200-3b, 200-4b, 200-5b and 200-6b. Likewise, even-numbered unit pixels 500 of the corresponding pixel column are connected to remaining data lines, e.g., to data lines to which the odd-numbered unit pixels 500 are not connected.

In an exemplary embodiment of the present invention, same gate driving pulse is applied to adjacent gate lines (e.g., to the first gate line 100-Ga and the second gate line 100-Gb of FIG. 2) which are connected to adjacent unit pixels 500.

As a result, an amount of time allocated to each gate line for applying a gate turn-on voltage is substantially increased for each gate line, even when a number of gate lines is increased to improve resolution. More specifically, in an exemplary embodiment of the present invention in which the resolution increases from 1,920×1,080 to 4,096×2,160, for example, 1,080 gate lines are required to realize 1,920×1,080 resolution. In contrast, 2,160 gate lines are required to realize 4,096×2,160 resolution. However, an amount of time allocated time for displaying one image frame is identical in both cases. For purposes of illustration, both cases will be described based on an assumption that the amount of time allocated for displaying one image frame is, for example, 1 (one) second. In the case of the display device having 1,080 gate lines, the gate turn-on voltage is applied for one second to all the gate lines, e.g., 1,080 gate lines, and, accordingly, the amount of time allocated to a single gate line for applying the gate turn-on voltage is $\frac{1}{1,080}$ second. In the case of the display device having 2,160 gate lines, however, the gate turn-on voltage is applied for one second to all of the 2,160 gate lines, and accordingly the time allocated to one gate line for applying the gate turn-on voltage is decreased to $\frac{1}{2,160}$ second. That is, if the resolution is doubled, the amount of time allocated for applying the gate turn-on voltage to one gate line is reduced by half.

However, in an exemplary embodiment of the present invention, the gate turn-on voltage is simultaneously applied to two gate lines, e.g., to a first gate line 100-1a and a second gate line 100-1b (FIG. 1), and an amount of time allocated to one gate line e.g., to the first gate line 100-1a or the second gate line 100-1b, for applying the gate turn-on voltage is thereby not reduced, even when a number of gate lines is increased.

Since the gate turn-on voltage is simultaneously applied to the two gate lines, e.g., to the first gate line 100-1a and the second gate line 100-1b, which are adjacent to each other, two pixel rows connected to the two gate lines, e.g., to the first gate line 100-1a and the second gate line 100-1b operate at the same time. As a result, the first TFT 601 and the second TFT 602 in two unit pixels 500 vertically adjacent to each other are simultaneously turned on. In this case first TFT 601 and the second TFT 602, a resolution of a display device cannot be increased because the vertically adjacent two unit pixels display a same image. Accordingly, in the display device according to an exemplary embodiment of the present invention, the first TFT 601 and the second TFT 602 are disposed in an upper unit pixel 500, for example, are connected to one of the first data lines 200-1a, 200-2a, 200-3a, 200-4a, 200-5a and 200-6a, while the first TFT 601 and the second TFT 602 disposed in an adjacent lower unit pixel 500 are connected to one of the second data lines 200-1b, 200-2b, 200-3b, 200-4b, 200-5b and 200-6b. As a result, different gradation signals, e.g., different charges, are applied to the associated first data line 200-1a, 200-2a, 200-3a, 200-4a, 200-5a, 200-6a, and the associated second data line 200-1b, 200-2b, 200-3b, 200-4b, 200-5b and 200-6b, respectively. Consequently, the vertically adjacent two unit pixels 500 display different images, and a resolution of the display device is thereby substantially enhanced.

As described above, the display device according to an exemplary embodiment includes the charge control lines 300-1a, 300-2a, 300-1b and 300-2b for controlling an amount of charges in each of the first sub pixel 501 and the second sub pixel 502 of the unit pixel 500. More specifically, the charge control lines 300-1a, 300-2a, 300-1b and 300-2b extend substantially in the row direction of the pixel matrix, and are connected to pixel rows thereof The charge control lines 300-1a, 300-2a, 300-1b and 300-2b are electrically insulated from the gate lines 100-1a, 100-2a, 100-3a, 100-1b, 100-2b and 100-3b.

In an exemplary embodiment, the gate turn-on voltage is applied to the gate lines 100-1a, 100-2a, 100-3a, 100-1b, 100-2b or 100-3b to accumulate substantially the same charges in the first sub pixel 501 and the second sub pixel 502. As a result, when a gate turn-off voltage is applied to the gate lines 100-1a, 100-2a, 100-3a, 100-1b, 100-2b or 100-3b, the gate turn-on voltage, which turns on the charge control transistor 701, is also applied to the charge control lines 300-1a, 300-2a, 300-1b and 300-2b. Therefore, an amount of charges in at least one of the first sub pixel 501 and the second sub pixel 502 changes. Specifically, in an exemplary embodiment, an amount of charge in the second sub pixel 502 is reduced to thereby substantially improve visibility.

In an exemplary embodiment, the gate turn-on voltage to turn on the charge control transistor 701 is applied to the charge control lines 300-1a, 300-2a, 300-1b and 300-2b when the gate turn-off voltage is applied to the gate lines 100-1a, 100-2a, 100-3a, 100-1b, 100-2b or 100-3b, but alternative exemplary embodiments are not limited thereto. For example, in an alternative exemplary embodiment of the present invention, the gate turn-on voltage may be applied to the charge control transistor 701 some time after the gate turn-off voltage is applied to the gate lines 100-1a, 100-2a, 100-3a, 100-1b, 100-2b or 100-3b.

Referring now to FIG. 2, the first gate line 100-Ga and the second gate line 100-Gb, as well as the first charge control line 300-Ca and the second charge control line 300-Cb, extend in substantially the row direction. In addition, the first gate line 100-Ga and the second gate line 100-Gb, as well as the first charge control line 300-Ca and the second charge control line 300-Cb, each have a gate voltage input pad disposed at one terminal thereof FIG. 3 is a plan view of the display device according to the exemplary embodiment of the present invention shown in FIG. 1 and FIG. 4 is a partial cross-sectional view taken along line IV-IV' of FIG. 3.

Figure 3:
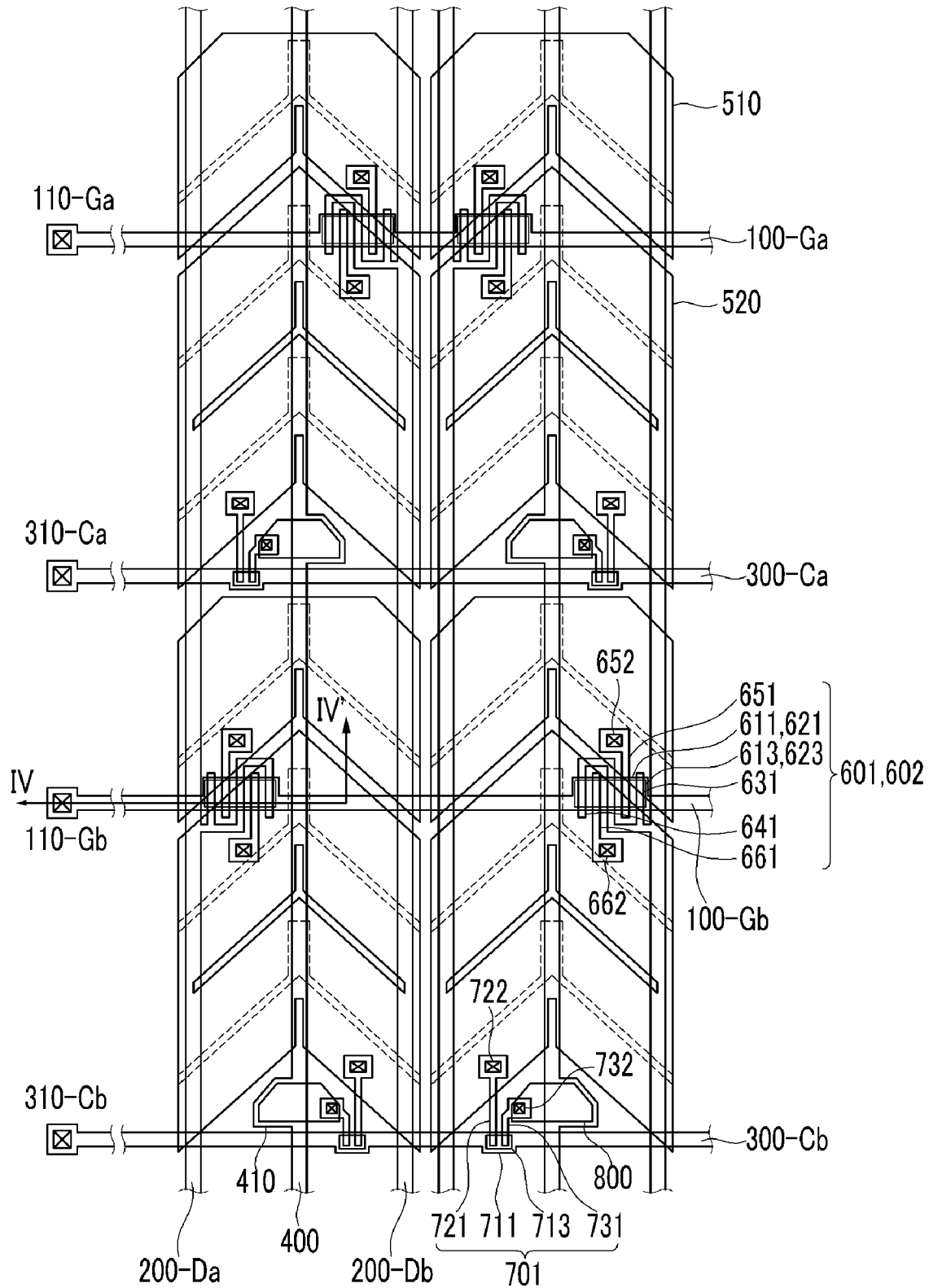
FIG. 3 is a plan view of the display device according to the exemplary embodiment of the present invention shown in FIG. 1.
Figure 4:
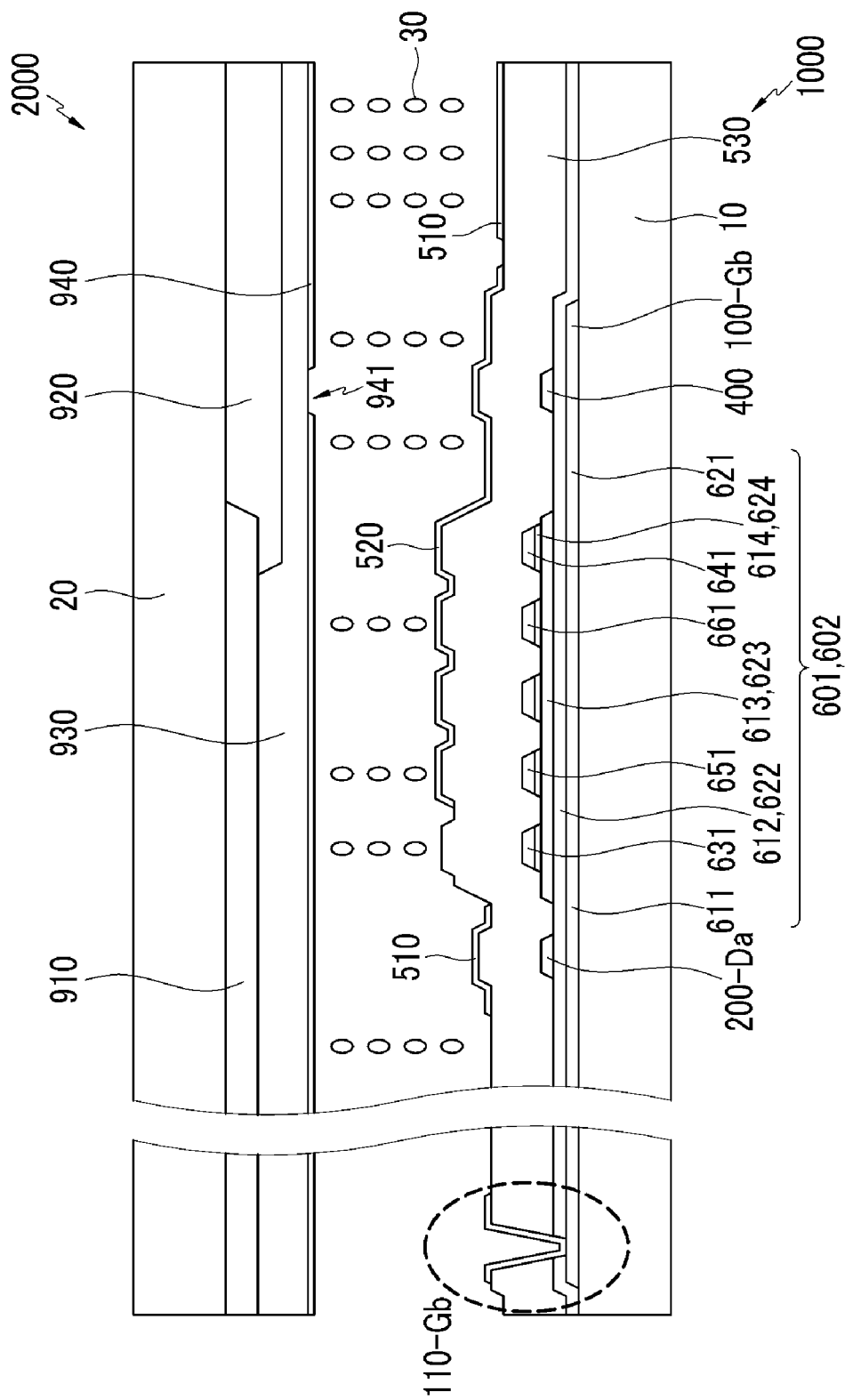
FIG. 4 is a partial cross-sectional view taken along line IV-IV' of FIG. 3.

Referring to FIGS. 3 and 4, the display device according to an exemplary embodiment of the present invention includes a TFT substrate 1000 as a lower substrate 1000, a common electrode substrate 2000 disposed opposite to, e.g., facing, the TFT substrate 1000 as an upper substrate 2000, and liquid crystals 30 disposed between TFT substrate 1000 and the common electrode substrate 2000.

An alignment layer (not shown) may be disposed on surfaces of the lower substrate 1000 and/or the upper substrate 2000 to align liquid crystals molecules of the liquid crystals 30.

In an exemplary embodiment of the present invention, an alignment mode of the liquid crystals 30 may be a vertical alignment mode, e.g., the liquid crystals 30 may be vertically aligned with respect to the upper substrate 2000 and the lower substrate 100, but alternative exemplary embodiments are not limited thereto.

The TFT substrate 1000 includes a transparent insulation substrate 10. The transparent insulation substrate 10 may include, for example, glass or transparent plastic, but alternative exemplary embodiments are not limited thereto.

The TFT substrate 1000 according to an exemplary embodiment includes the first gate line 100-Ga and the second gate line 100-Gb, described in greater detail above with reference to FIG. 2, extending in substantially the row direction on the transparent insulation substrate 10. Portions of the first gate line 100-Ga and the second gate line 100-Gb protrude in substantially the second, e.g., column, direction to form a first gate terminal and a second gate terminal, respectively, of the first TFT 601 and the second TFT 602, respectively. In an exemplary embodiment, the first gate line 100-Ga and the second gate line 100-Gb may have a monolayer structure or, alternatively, a multilayered structure including two or more layers. In a case where the first gate line 100-Ga and the second gate line 100-Gb have a multilayered structure with two or more layers, one layer may be formed of a low-resistance material and other layers may be formed of a material having good contact characteristics with other materials. For example, the first gate line 100-Ga and the second gate line 100-Gb according to an exemplary embodiment of the present invention may include a first layer of chromium (Cr) and a second layer of aluminum (Al) (or Al alloy) or, alternatively, a bi-layer including a first layer of Al (or Al alloy) and a second layer of molybdenum (Mo), but alternative exemplary embodiments are not limited thereto. Alternatively, for example, the first gate line 100-Ga and the second gate line 100-Gb may include various metal and/or conductive materials.

The TFT substrate 1000 according to an exemplary embodiment of the present invention includes the first charge control line 300-Ca and the second charge control line 300-Cb extending in substantially the same direction, e.g., in the row direction, as the first gate line 100-Ga and the second gate line 100-Gb. Portions of the first charge control line 300-Ca and the second charge control line 300-Cb protrude in substantially the column direction to form a gate terminal 711 of the charge control transistor 701. In an exemplary embodiment of the present invention, the first charge control line 300-Ca and the second charge control line 300-Cb are formed of substantially the same material as the first gate line 100-Ga and the second gate line 100-Gb, as well as on substantially the same plane defined thereby.

The first gate line 100-Ga, the second gate line 100-Gb, the first charge control line 300-Ca and the second charge control line 300-Cb have gate voltage input pads 110, 310, respectively, disposed at a terminal of respective gate lines and charge control line, as shown in FIG. 3. More specifically, a first gate voltage input pad 110-Ga and a second gate voltage input pad 110-Gb are disposed at ends of the first gate line 100-Ga and the second gate line 100-Gb, respectively. Likewise, a first charge control gate voltage input pad 310-Ca and a second charge control gate voltage input pad 31 0-Cb are disposed at ends of the first charge control line 300-Ca and the second charge control line 300-Cb, respectively.

Further, the gate voltage input pads 110, 310 are formed in an outer peripheral region of the TFT substrate 1000 and, during operation, provide a gate voltage which is inputted from the external circuit (not shown) to the first gate line 100-Ga, the second gate line 100-Gb, the first charge control line 300-Ca and the second charge control line 300-Cb.

As described above in further detail with reference to FIGS. 1 and 2, the gate voltage is inputted from the external circuit such that after a gate turn-on voltage is applied to adjacent gate lines connected to two adjacent unit pixels, the gate turn-on voltage for turning on associated charge control transistors is applied to adjacent charge control lines connected to the two adjacent unit pixels.

Still referring to FIGS. 3 and 4, the TFT substrate 1000 according to an exemplary embodiment of the present invention includes the first data line 200-Da and the second data line 200-Db which intersect the first gate line 100-Ga and the second gate line 100-Gb. The first data line 200-Da and the second data line 200-Db are disposed substantially adjacent to the left and the right sides of the pixel column of the pixel matrix, as described above in greater detail with reference to FIGS. 1 and 2. Portions of the first data line 200-Da and the second data line 200-Db protrude to form a first source terminals 631 and a second source terminal 641, respectively, of the first TFT 601 and the second TFT 602, respectively. The first data line 200-Da and the second data line 200-Db according to an exemplary embodiment of the present invention may have a monolayer structure or, alternatively, a multilayered structure including two or more layers having different physical properties. In an exemplary embodiment wherein the first data line 200-Da and the second data line 200-Db are formed to have the multilayered structure with two or more layers, one layer may include a low-resistance material (to reduce a delay of a data signal and/or a voltage drop), while other layers may be formed of a material having good contact characteristics with other materials. Although the first data line 200-Da and the second data line 200-Db are illustrated in FIG. 3 to have a substantially rectilinear shape, alternative exemplary embodiments of the present invention are not limited thereto. For example, the first data line 200-Da and the second data line 200-Db according to an alternative exemplary embodiment of the present invention may have shapes which include, but are not limited to, a straight line having periodically alternating bends therein or, alternatively, a curved line.

The TFT substrate 1000 according to an exemplary embodiment of the present invention further includes a plurality of storage lines 400 extending through a region substantially defined between the first data line 200-Da and the second data line 200-Db. More specifically, storage lines 400 of the plurality of storage lines 400 extend substantially parallel to the first data line 200-Da and the second data line 200-Db. The storage line 400 according to an exemplary embodiment of the present invention may be formed of substantially the same material as the first data line 200-Da and the second data line 200-Db and on substantially the same plane defined therewith. The storage line 400 is used as electrode terminals of the first storage capacitor Cst1 and the second storage capacitor Cst2. As illustrated in FIG. 3, a portion of the storage line 400 protrudes in substantially the row direction to form a protrusion 410. In an exemplary embodiment, the protrusion 410 is used as an electrode terminal of the charge down capacitor Cdown.

The storage line 400 may pass through a central region of the unit pixel in substantially the column direction. The first TFT 601 and the second TFT 602 in each of the unit pixels 500 arranged in the column direction are alternately arranged at a left side and a right side of the storage line 400. Thus, when there are two unit pixels 500 in a same pixel column, as illustrated in FIG. 3, the first TFT 601 and the second TFT 602 in an upper unit pixel are disposed at the right side of the storage line 400, while the first TFT 601 and the second TFT 602 in a lower unit pixel 500 are disposed at the left side of the storage line 400.

The TFT substrate 1000 includes a first pixel electrode 510 and a second pixel electrode 520. The first pixel electrode 510 is an electrode terminal of the first liquid crystal capacitor Clc1 and the first storage capacitor Cst1, and the second pixel electrode 520 is an electrode terminal of the second liquid crystal capacitor Clc2 and the second storage capacitor Cst2. The first pixel electrode 510 and the second pixel electrode 520 are formed of a transparent conductive material such as indium tin oxide ("ITO") or indium zinc oxide ("IZO"), for example. The first pixel electrode 510 and the second pixel electrode 520 are provided in each unit pixel region. The first pixel electrode 510 and the second pixel electrode 520 are spaced apart from each other by a cut-out portion, as shown in FIG. 3. In an exemplary embodiment of the present invention, the cut-out portion may have a shape of a "V", as illustrated in FIG. 3. In addition, the first pixel electrode 510 is disposed at an upper side of the unit pixel region, and the second pixel electrode 520 is disposed at a lower side of the unit pixel region. The first pixel electrode 510 and the second pixel electrode 520 include a plurality of domains. Cut-out patterns and/or protrusions are used to divide, e.g., to separate, domains of the plurality of domains.

In an exemplary embodiment of the present invention, the first pixel electrode 510 and the second pixel electrode 520 may be symmetrically arranged with respect to, e.g., mirrored about, the storage line 400. In an exemplary embodiment of the present invention, an insulation layer (not shown) is disposed between the first pixel electrode 510 and the second pixel electrode 520 and underlying structures, e.g., the first TFT 601, the second TFT 602, the first gate line 100-Ga, the second gate line 100-Gb, the first data line 200-Da, the second data line 200-Db and/or the storage line 400. An organic layer and/or an inorganic layer may be used as the insulation layer.

In an exemplary embodiment, the first gate line 100-Ga and the second gate line 100-Gb are disposed to cross a region between the first pixel electrode 510 and the second pixel electrode 520, e.g., the cut-out region, in the substantially row direction, as illustrated in FIG. 3. As the first gate line 100-Ga and the second gate line 100-Gb are disposed inside the unit pixel region, an overlapping area between the first gate line 100-Ga and the second gate line 100-Gb and the first pixel electrode 510 and the second pixel electrode 520 becomes uniform. Thus, parasitic capacitance occurring in the overlapping area is substantially reduced and/or effectively eliminated.

Thus, the TFT substrate 1000 according to an exemplary embodiment of the present invention includes the first TFT 601 and the second TFT 602 connected to one of the first data line 200-Da and the second data line 200-Db, respectively, and one of the first gate line 100-Ga and the second gate line 100-Gb, respectively.

Still referring to FIGS. 3 and 4, the first TFT 601 according to an exemplary embodiment of the present invention includes a first gate terminal 611, a first source terminal 631 and a first drain terminal 651. Likewise, the second TFT 602 includes a second gate terminal 621, a second source terminal 641 and a second drain terminal 661. The first TFT 601 further includes a gate insulating layer 612 on the first gate terminal 611, an active layer 613 on the gate insulating layer 612 and an ohmic contact layer 614. The second TFT 602 also further includes a gate insulating layer 622 on the second gate terminals 621, an active layer 623 on the gate insulating layer 622 and an ohmic contact layer 624. As illustrated in FIGS. 3 and 4, the first gate terminal 611 and the second gate terminal 621 are formed as a single body. The gate insulating layers 612 and 622 according to an exemplary embodiment of the present invention may include a silicon nitride layer or, alternatively, a silicon oxide layer. The active layer 613 and 623 are disposed on the first gate terminal 611 and the second gate terminal 621, respectively. The first source terminal 631 and the second source terminal 641 are formed on the active layers 613 and 623, respectively. The first drain terminal 651 is connected to the first pixel electrode 510 through a first pixel contact hole 652. The second drain terminal 661 is connected to the second pixel electrode 520 through a second pixel contact hole 662.

In an exemplary embodiment of the present invention, the active layers 613 and 623 are positioned only the first gate terminal 611 and the second gate terminal 621, respectively, and may also be positioned proximate to the first drain terminal 651 and the second drain terminal 661, respectively. Specifically, the active layers 613 and 623 may be positioned a lower regions of the first data line 200-Da and the second data line 200-Db. In this case, the active layers 613 and 623 are disposed under the first data line 200-Da and the second data line 200-Db, and the first data line 200-Da and the second data line 200-Db, as well as the active layers 613 and 623 have substantially the same planar shape.

The charge control transistor 701 includes the gate terminal 711 connected to the first charge control line 300-Ca and the second charge control line 300-Cb, a gate insulating layer (not shown) disposed on the gate terminal 711, an active layer 713 disposed on the gate insulating layer over the gate terminal 711, a source terminal 721 and a drain terminal 731 disposed on the active layer 713. The source terminal 721 is connected to the second pixel electrode 520 through a source contact hole 722. The drain terminal 731 is connected to a charge control electrode 800 through a drain contact hole 732. The charge control electrode 800 is used as an electrode terminal of the charge down capacitor Cdown. Thus, a portion of the charge control electrode 800 overlaps the protrusion 410 of the storage line 400, as shown in FIG. 3. As a result, when the charge control transistor 701 is turned on, charge which has accumulated in the second pixel electrode 520 is transferred to the charge control electrode 800 via the charge control transistor 701. The charge control electrode 800 is formed between each of the first pixel electrode 510 and the second pixel electrode 520. Specifically, the charge control electrode 800 is disposed in the cut-out region at the lower side of the second pixel electrode 520, and the charge control transistor 701 is disposed in a region adjacent to the cut-out region at the lower side of the second pixel electrode 520. Thus, a required length of an interconnection for connecting the charge control electrode 700 to the charge control transistor 701 and/or the first pixel electrode 510 and the second pixel electrode 520 is substantially reduced and/or effectively minimized, thereby substantially reducing an aperture ratio of the display device according to an exemplary embodiment of the present invention.

Still referring to FIGS. 3 and 4, in an exemplary embodiment of the present invention, the common electrode substrate 2000 includes a light transmitting insulating substrate 20, a light shielding pattern 910, color filters 920, an overcoat layer 930 disposed on the light shielding pattern 910 and the color filters 920, and a common electrode 940 disposed on the overcoat layer 930. In an exemplary embodiment of the present invention, the color filters 920 include red, green and/or blue color filters 920. The light shielding pattern 910 prevents light leakage and/or light interference between the adjacent unit pixel regions. In an exemplary embodiment of the present invention, a black matrix 910 is used as the light shielding pattern 910. In addition, the overcoat layer 930 according to an exemplary embodiment includes an organic material. The common electrode 940 is formed of a transparent conductive material such as ITO or IZO, for example.

A plurality of cut-out patterns 941 are provided in the common electrode 940 for controlling the domains (described in greater detail above), but alternative exemplary embodiments of the present invention are not limited thereto. Alternatively, protrusions, for example, may be employed to control the domains.

The common electrode 940 is an electrode terminal of each of the first liquid crystal capacitor Clc1 and the second liquid crystal capacitor Clc2. Specifically, in the first liquid crystal capacitor Clc1, the first pixel electrode 510 is an upper electrode, the common electrode 940 is a lower electrode, and the liquid crystals 30 act as a dielectric therebetween. Similarly, in the second liquid crystal capacitor Clc2, the second pixel electrode 520 is an upper electrode, the common electrode 940 is a lower electrode, and the liquid crystals 30 act as a dielectric therebetween.

The TFT substrate 1000 and the common electrode substrate 2000 are attached to each other with the liquid crystals 30 interposed therebetween to manufacture a base panel of the display device according to an exemplary embodiment of the present invention. In addition, the display device may further include a polarization film, a backlight and an optical plate/sheet, for example, disposed at sides of the base panel.

Thus, in an exemplary embodiment, the gate turn-on voltage is applied to the first gate line 100-Ga and the second gate line 100-Gb adjacent thereto. As a result, a charging time, e.g., a gate turn-on time of a TFT, can be prevented from being reduced, even when the resolution is increased. In addition, a unit pixel can be manufactured to include the first sub pixel and the second sub pixel, and a charge controller which is driven based a next gate turn-on voltage, e.g., a temporally subsequent and adjacent gate turn-on voltage, thus controls an amount of charge in the second sub pixel. In an exemplary embodiment of the present invention, the first sub pixel is a main pixel representing a high gradation, while the second sub pixel is a sub pixel representing a low gradation. Therefore, a visibility, e.g., a display quality, of the display device according to an exemplary embodiment of the present invention is substantially improved.

Hereinafter, a method of fabricating the display device according to an exemplary embodiment of the present invention will be described in further detail.

Figure 6:
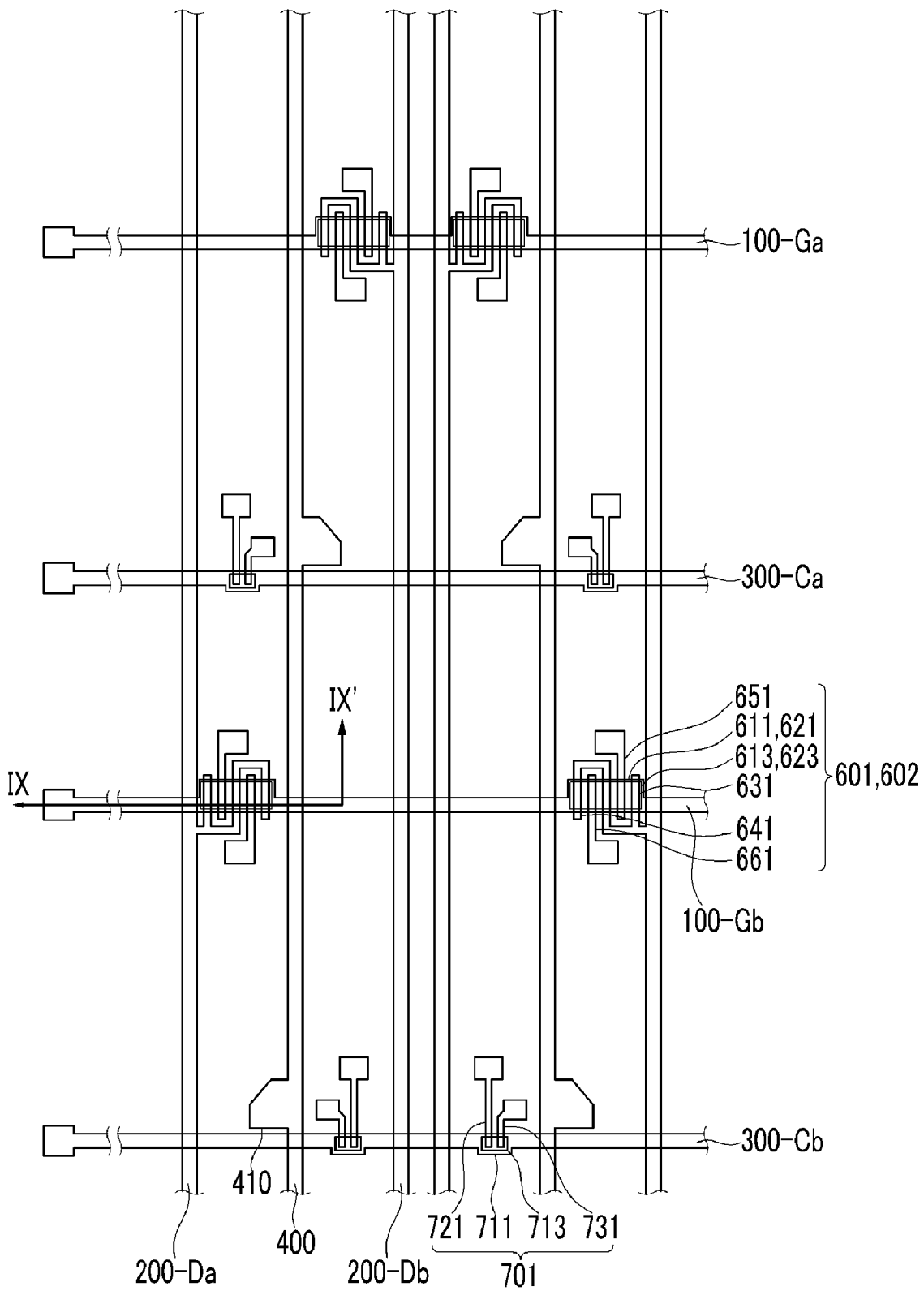
Figure 7:
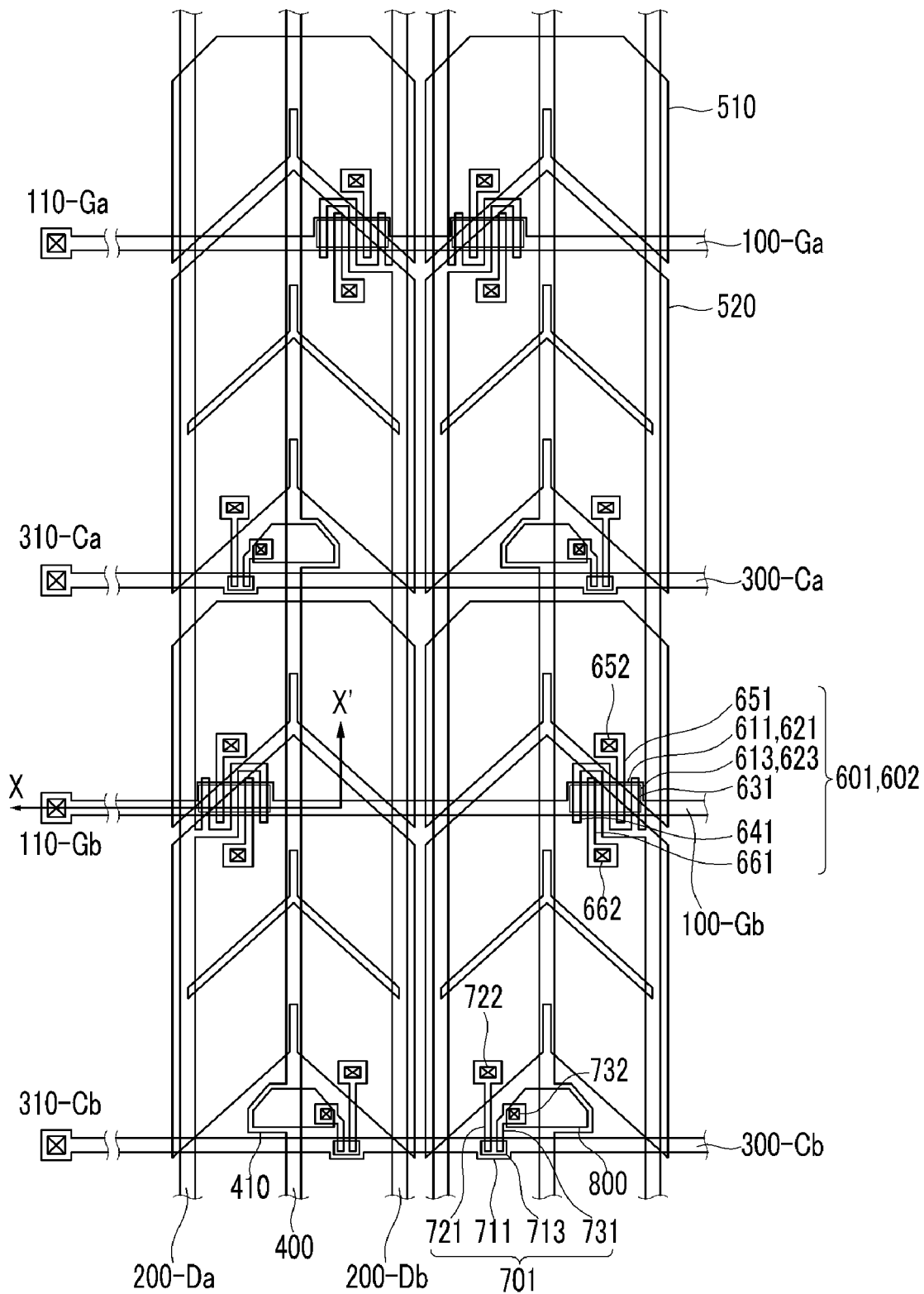
Figure 8:
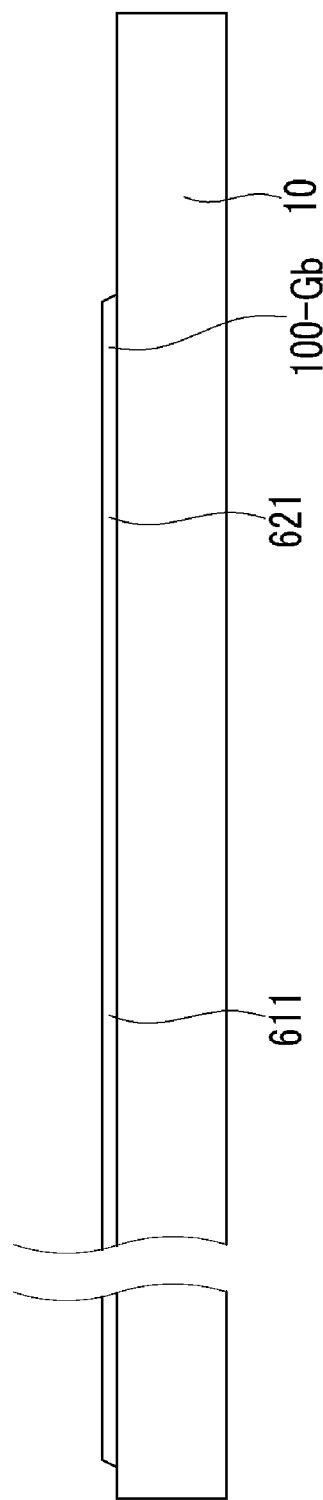
FIG. 8 is a partial cross-sectional view taken along line VIII-VIII' of FIG. 5.
Figure 9:
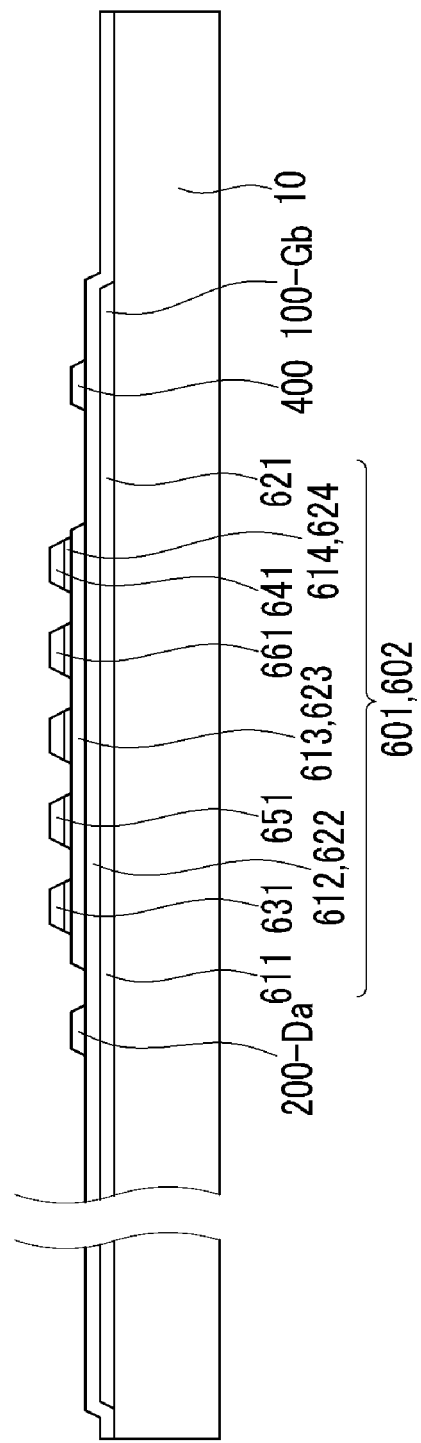
FIG. 9 is a partial cross-sectional view taken along line IX-IX' of FIG. 6.
Figure 10:
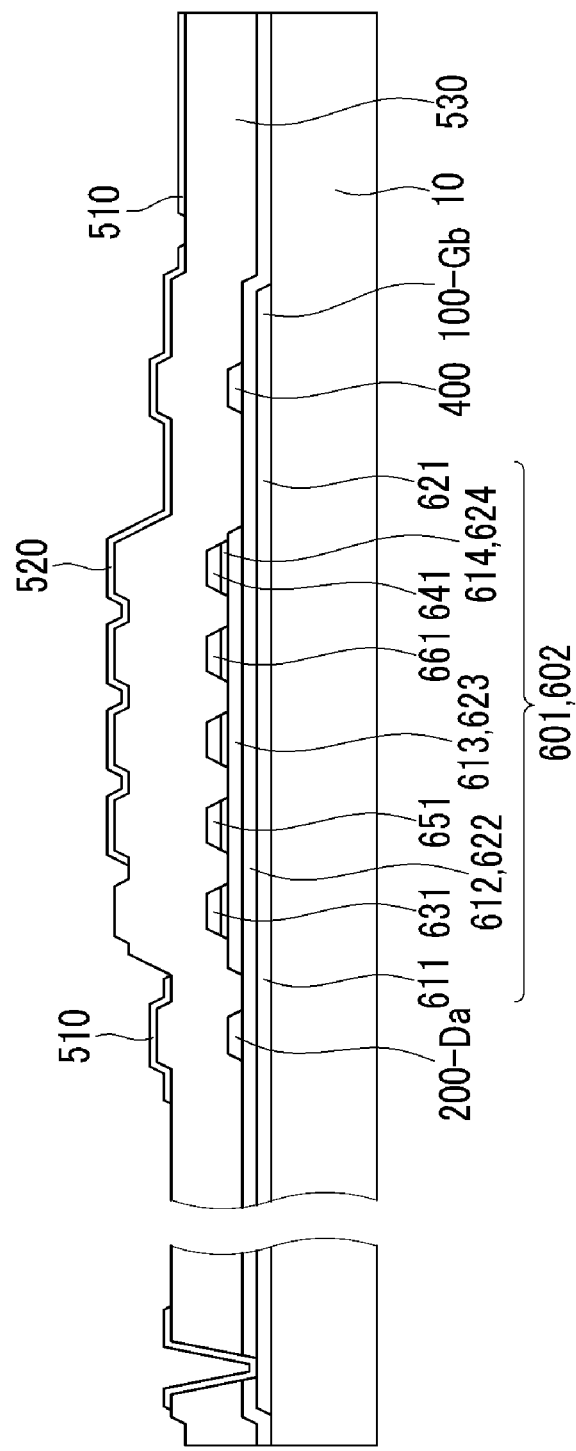
FIG. 10 is a partial cross-sectional view taken along line X-X' of FIG. 7.

FIGS. 5 through 7 are plan views illustrating steps of a method of fabricating a TFT substrate according to an exemplary embodiment of the present invention. FIG. 8 is a partial cross-sectional view taken along line VIII-VIII' of FIG. 5, FIG. 9 is a partial cross-sectional view taken along line IX-IX' of FIG. 6, and FIG. 10 is a partial cross-sectional view taken along line X-X' of FIG. 7. The same reference characters in FIGS. 5-9 refer to the same or like components as in FIGS. 1-4, and any repetitive detailed description thereof will hereinafter be omitted.

Referring to FIGS. 5 and 8, a first conductive layer is formed on a substrate 10. The first conductive layer (not fully shown) is patterned to form the first gate line 100-Ga, the second gate line 100-Gb, the first charge control line 300-Ca and the second charge control line 300-Cb. The gate voltage input pads 110 and the charge control gate voltage input pads 310 are formed at respective terminals of the first gate line 100-Ga, the second gate line 100-Gb, the first charge control line 300-Ca and the second charge control line 300-Cb. Gate terminals 611 and 621 of first and second TFTs and a gate terminal 711 of a charge control transistor (described in greater detail above with reference to FIGS. 1-4) are simultaneously formed.

In an exemplary embodiment of the present invention, the first conductive layer may include at least one of Cr, MoW, Cr/Al, Cu, Al (Nd), Mo/Al, Mo/Al (Nd), Cr/Al (Nd), Mo/Al/ Mo and combinations thereof, but alternative exemplary embodiments of the present invention are not limited thereto. For example, the first conductive layer may include at least one of Al, Nd, Ag, Cr, Ti, Ta, Mo and combinations thereof, or an alloy including at least one of the foregoing elements. Further, the first conductive layer may be formed to have a monolayer or, alternatively, a multilayered structure. Specifically, the first conductive layer may be a bi-layer structure or, alternatively, a tri-layer structure including a metal layer having good physical and chemical properties, such as Cr, Ti, Ta and Mo, for example, and a metal layer having low specific resistivity, such as an Al-based metal or an Ag-based metal, for example. After forming the first conductive layer on a surface of the substrate, a photoresist layer is formed thereon and a lithography process is performed using a mask to form a photoresist mask pattern. An etch process is performed using the photoresist mask pattern as an etch mask. As a result, the first gate line 100-Ga and the second gate line 100-Gb and the gate terminals 611 and 621, respectively, are formed, as illustrated in FIGS. 5 and 8. The first charge control line 300-Ca and the second charge control line 300-Cb are formed, and the gate terminal 711 of the charge control transistor 701 (FIG. 3) is formed on the first charge control line 300-Ca and the second charge control line 300-Cb.

Referring now to FIGS. 6 and 9, gate insulating layers 612 and 622, a thin film for an active layer and a thin film for an ohmic contact layer are sequentially formed on the substrate 10 where the first gate line 100-Ga and the second gate line 100-Gb are formed. Then, the thin film for the active layer and the thin film for the ohmic contact layer are patterned to form active layers 613, 623 and 713, and ohmic contact layers 614 and 624.

In an exemplary embodiment of the present invention, the gate insulating layers 612 and 622 may include an inorganic insulating material such as silicon oxide or silicon nitride, for example. An amorphous silicon layer is used as the thin film for the active layer. A silicide or, alternatively, an amorphous silicon layer heavily doped with n-type impurities, is used as the thin film for the ohmic contact layer.

Next, a second conductive layer is formed patterned to form the first data line 200-Da and the second data line 200-Db, source terminals 631, 641 and 721, drain terminals 651, 661 and 731 and the storage line 400. The second conductive layer according to an exemplary embodiment of the present invention may include a single layer or, alternatively, a multi-layer, which may be formed of one or more of Mo, Al, Cr, Ti and combinations thereof, for example. In an exemplary embodiment, the second conductive layer may be formed of substantially the same material used for the first conductive layer.

Thus, the first TFT 601 and the second TFT 602, as well as the charge control transistor 701 are fabricated, each of which includes gate terminals 611, 621 and 711, respectively, source terminals 631, 641 and 721, respectively, and drain terminals 651, 661 and 731, respectively.

Referring now to FIGS. 7 and 10, a passivation layer 530 is disposed on the substrate 10 where the first TFT 601, the second TFT 602 and the charge control transistor 701 are formed. The passivation layer 530 is partially removed by an etch process using a photoresist mask pattern, for example, to form the first pixel contact hole 652 and the second pixel contact hole 662 which expose portions of the drain terminals 651 and 661, respectively, of the first TFT 601 and the second TFT 602, respectively. In addition, a source contact hole 722 is formed to expose a portion of the source terminal 721 of the charge control transistor 701, and a drain contact hole 732 is formed to expose a portion of the drain terminal 731 of the charge control transistor 701.

A third conductive layer is then formed on the passivation layer 530 proximate to the abovementioned contact holes. The third conductive layer is patterned using a photoresist mask pattern to form the first pixel electrode 510 and the second pixel electrode 520 having the cut-out patterns formed therebetween.

In an exemplary embodiment of the present invention, the third conductive layer may include a transparent conductive layer such as ITO or IZO, for example. The first pixel electrode 510 is connected to the drain terminal 651 of the first TFT 601 through the first pixel contact hole 652. The second pixel electrode 520 is connected to the drain terminal 661 of the second TFT 602 through the second pixel contact hole 662, and is connected to the source terminal 721 of the charge control transistor 701 through the source contact hole 722. The charge control electrode 800 is connected to the drain terminal 731 of the charge control transistor 701 through the drain contact hole 732.

After forming the first pixel electrode 510 and the second pixel electrode 520, a first alignment layer (not shown) is formed thereon, thereby completing a lower substrate, e.g., the TFT substrate.

In an exemplary embodiment of the present invention, a common electrode substrate (not shown) is prepared by sequentially forming a black matrix, color filters, an overcoat layer, protrusive patterns, a transparent common electrode and a second alignment layer over a transparent insulation substrate. Thereafter, the TFT substrate and the common electrode substrate are attached to each other with a spacer (not shown) interposed therebetween. Subsequently, a liquid crystal layer is formed by injecting liquid crystal material into a space formed by the spacer between the TFT substrate and the common electrode substrate, thus completing the LCD according to an exemplary embodiment of the present invention.

Although the TFT substrate according to an exemplary embodiment of the present is formed using five sheet masks, as described herein, the masking process is not limited thereto. For example, the TFT substrate according to an alternative exemplary embodiment of the present invention may be formed using more than five sheet masks or, alternatively, less than five sheet masks.

Figure 11:
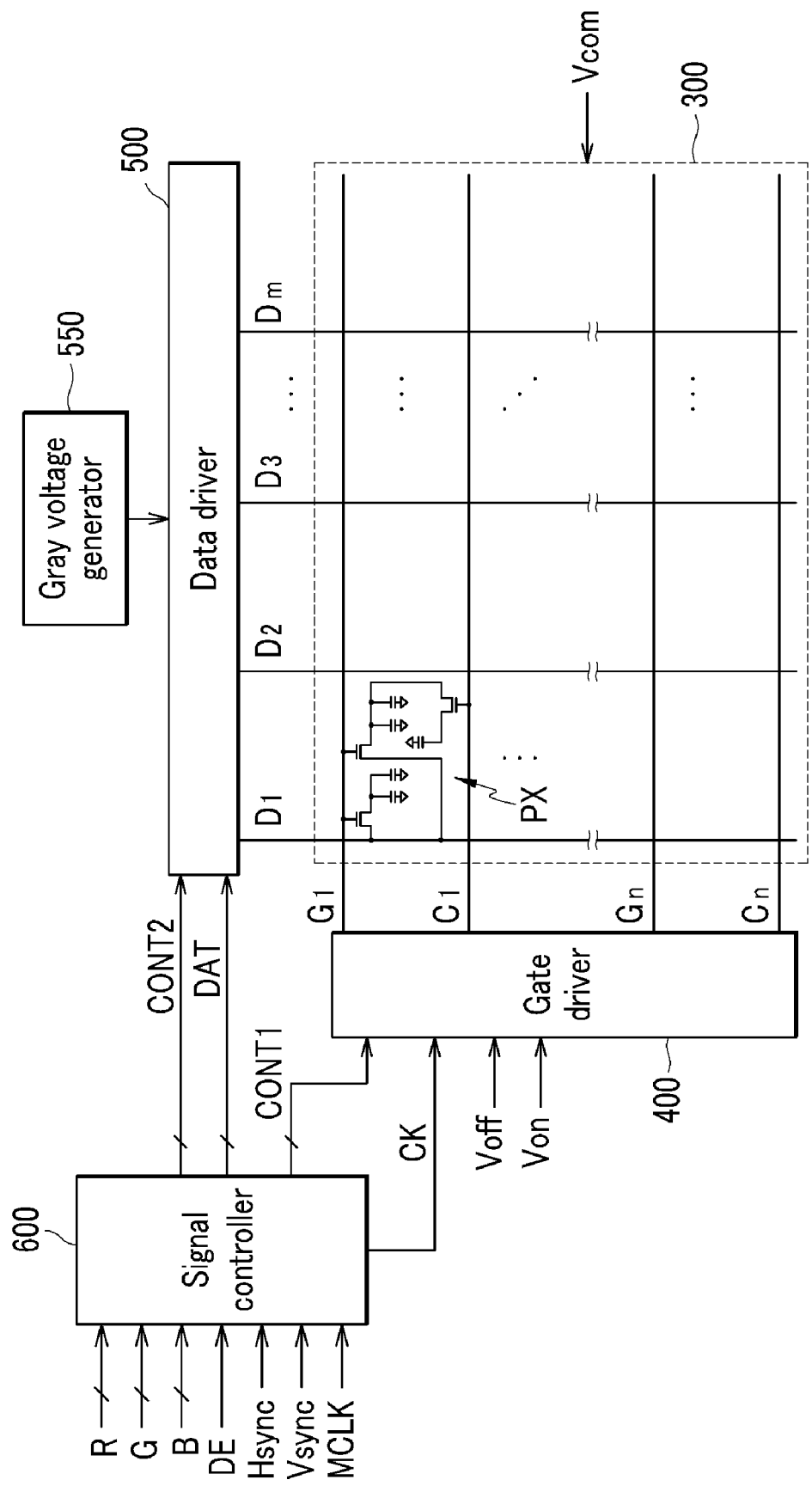
FIG. 11 is a block diagram of a display device according to an alternative exemplary embodiment of the present invention.

FIG. 11 is a block diagram of a display device according to an alternative exemplary embodiment of the present invention.

As shown in FIG. 11, a display device according to an exemplary embodiment includes a liquid crystal panel assembly 300, a gate driver 400 and a data driver 500 connected thereto, a gray voltage generator 550 connected to the data driver 500 and a signal controller 600 controlling the abovementioned components, for example.

In an exemplary embodiment, the liquid crystal panel assembly 300 includes a plurality of signal lines G1-Gn, C1-Cn, and D1-Dm, and a plurality of pixels PX connected to the plurality of signal lines G1-Gn, C1-Cn, and D1-Dm and arranged in a matrix including, for example, pixel rows and pixel columns and, more particularly, even-numbered pixel rows and odd-numbered pixel rows (best shown in FIG. 1 and described in greater detail above with reference thereto).

The plurality of signal lines G1-Gn, C1-Cn, and D1-Dm includes gate lines G1-Gn that transmit gate signals (also referred to as "scanning signals"), charge control lines C1-Cn that transmit charge control signals, and data lines D1-Dm that transmit data signals. The gate lines G1-Gn and the charge control lines C1-Cn extend in a first, substantially, row, direction to be substantially parallel to each other, and the data lines D1-Dm extend in a second, substantially, column direction to be parallel to each other. The first direction thereby crosses the second direction and, in an exemplary embodiment, the first direction is substantially perpendicular to the second direction.

Referring to FIGS. 11 and 2, each pixel PX includes switching elements 601, 602, and 701 connected to the plurality of signal lines G1-Gn, C1-Cn, and D1-Dm, liquid crystal capacitors Clc1 and Clc2, storage capacitors Cst1 and Cst2, and a charge-down capacitor Cdown connected thereto. In an exemplary embodiment, the storage capacitors Cst1 and Cst2 may be omitted.

Connection relationships between the plurality of signal lines G1-Gn, C1-Cn, and D1-Dm, the switching elements 601, 602, and 701, the liquid crystal capacitors Clc1 and Clc2, the storage capacitors Cst1 and Cst2, and the charge-down capacitor Cdown are substantially the same as described in greater detail above with reference to FIGS. 1 and 2, and any repetitive detailed description thereof will hereinafter be omitted.

In an exemplary embodiment, the gray voltage generator 550 generates two gray voltage groups related to a transmittance of the pixel PX. One of the two gray voltage groups has a positive value with respect to a common voltage Vcom, and the other gray voltage group has a negative value with respect to the common voltage Vcom.

The gate driver 400 is connected to the gate lines G1 to Gn and the charge control lines C1-Cn of the liquid crystal panel assembly 300, and applies gate signals that include a combination of a gate-on voltage Von and a gate-off voltage Voff, and a charge control signal VONC (FIGS. 12 and 13) to the gate lines G1 to Gn and the charge control lines C1-Cn, based on a first control signal CONT1 supplied from the single controller 600. In an exemplary embodiment, the gate driver 400 includes of a plurality of integrated circuits ("ICs").

The data driver 500 is connected to the data lines D1 to Dm of the liquid crystal panel assembly 300, and the data driver 500 selects gray voltages from the gray voltage generator 550 and applies the selected gray voltages to the data lines D1 to Dm as data signals, based on a second control signal CONT2 and an image data signal DAT supplied 20 from the single controller 600. In an exemplary embodiment, the data driver 500 includes a plurality of ICs.

The signal controller 600 controls the gate driver 400 and the data driver 500 by outputting the first control signal CONT1, the second control signal CONT2 and the image data signal DAT, based on various signals supplied from an external source (not shown), such as input image signals R, G and B, a data enable signal DE, a horizontal synchronization signal Hsync, a vertical synchronization signal Vsync and a master clock signal MCLK, for example. The signal controller 600 also outputs a clock ("CK") signal CK having a CK on pulse (FIG. 12) to the gate driver 400 for determining a duration time of the gate-on voltage Von (e.g., a turn-on voltage pulse), for generating the gate signals Von and Voff, and for generating the charge control signal VONC outputted differently from the gate signals. For example, the CK on pulse width for generating the charge control signal VONC may be shorter than the CK on pulse width for generating the gate signals.

Figure 12:
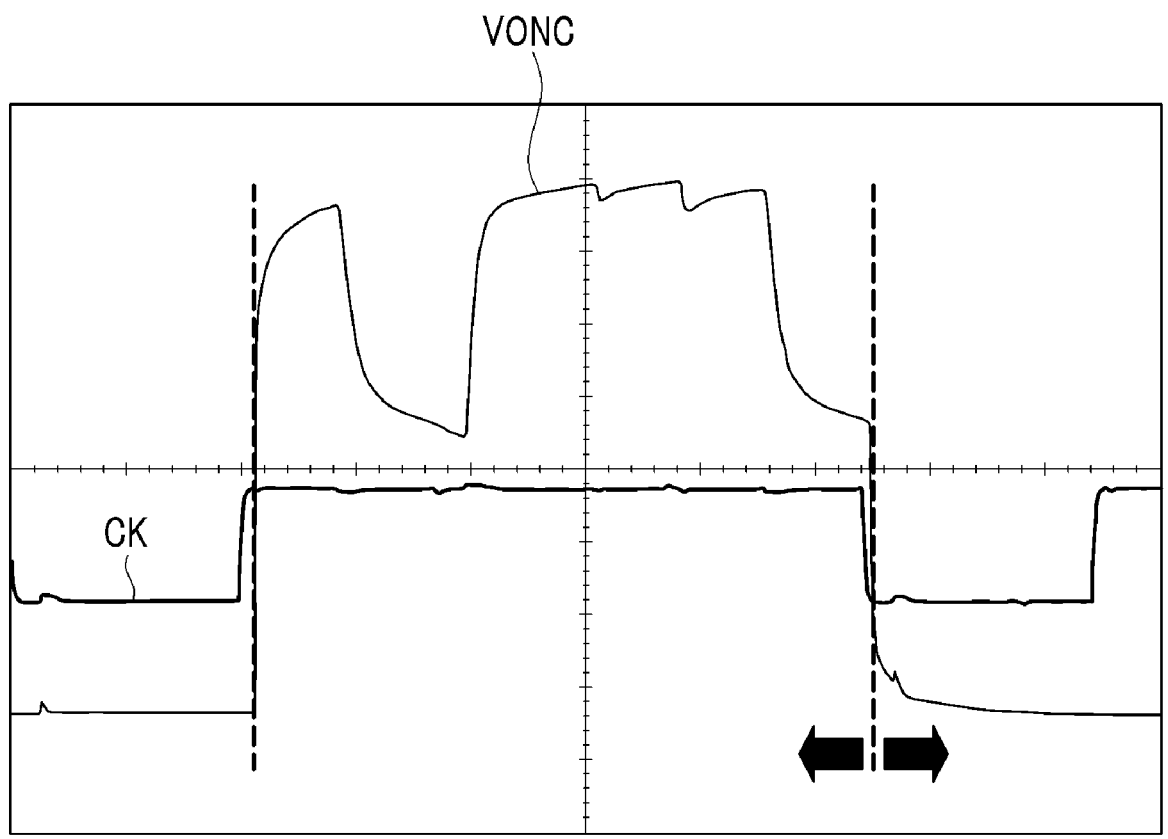
FIG. 12 is a signal timing diagram of a turn-on voltage pulse applied to a control electrode of a charge control thin film transistor in the display device shown in FIG. 11.

FIG. 12 is a signal timing diagram of a turn-on voltage pulse applied to a control electrode of a charge control thin film transistor in the display device shown in FIG. 11.

Referring to FIG. 12, a width of the gate signal and the charge control signal VONC is determined by the CK on pulse width. Accordingly, the CK on pulse width for generating the charge control signal VONC is shorter or, alternatively, is longer than the CK on pulse width for generating the gate signals. As a result, a width of the turn-on voltage pulse of the charge control signal VONC is controlled differently from the gate signal. Therefore, the charge voltage of the second liquid crystal capacitor is controlled based on a charge amount dispersed into the charge-down capacitor, and thereby gamma characteristics of a sub-pixel receiving a relatively low voltage are controlled. As a result, display quality deteriorations, such as a reddish color in images inclined toward a red side of a gamma curve are substantially reduced and/or effectively eliminated in a display device according to an exemplary embodiment.

Figure 13:
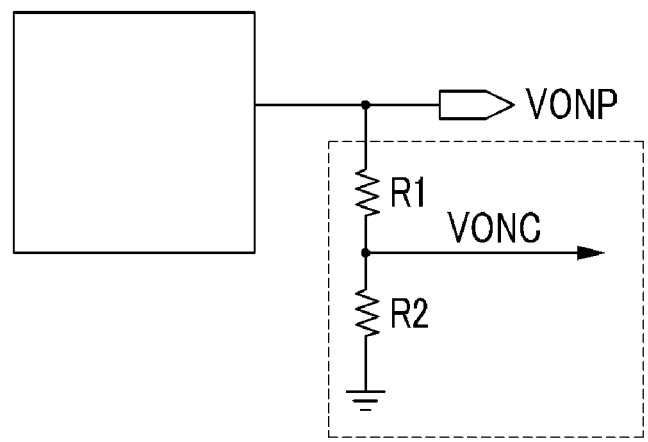
FIG. 13 is a schematic circuit diagram of a turn-on voltage generating circuit applied to a control electrode of a charge control thin film transistor in a display device according to another alternative exemplary embodiment of the present invention.

FIG. 13 is a schematic circuit diagram of a turn-on voltage generating circuit applied to a control electrode of a charge control thin film transistor in a display device according to yet another alternative exemplary embodiment of the present invention.

In an exemplary embodiment for controlling gamma characteristics of the low voltage sub-pixel, a magnitude of the turn-on voltage applied to the control electrode of the charge control thin film transistor is different from a magnitude of a turn-on voltage applied to the gate electrode of the thin film transistor for the data signal switching. Thus, the magnitude of the turn-on pulse of the charge control signal VONC may be smaller or, alternatively, larger than the magnitude of the turn-on pulse of the gate signal. Hereinafter, a case in which the magnitude of the turn-on pulse of the charge control signal VONC is smaller than the magnitude of the turn-on pulse of the gate signal will be described in greater detail, but alternative exemplary embodiments are not limited thereto.

Referring to FIG. 13, voltage dividing resistors R1 and R2 are connected to a gate signal output terminal VONP, and the charge control signal VONC is generated between the dividing resistors R1 and R2, such that the charge control signal VONC has a smaller magnitude than a voltage of the gate signal by a ratio of R2/(R1+R2) (where "R1" and "R2" represent respective resistance values of the dividing resistors R1 and R2). It will be noted that, in an alternative exemplary embodiment, more than two voltage dividing resistors R1 and R2 may be included.

Figure 14:
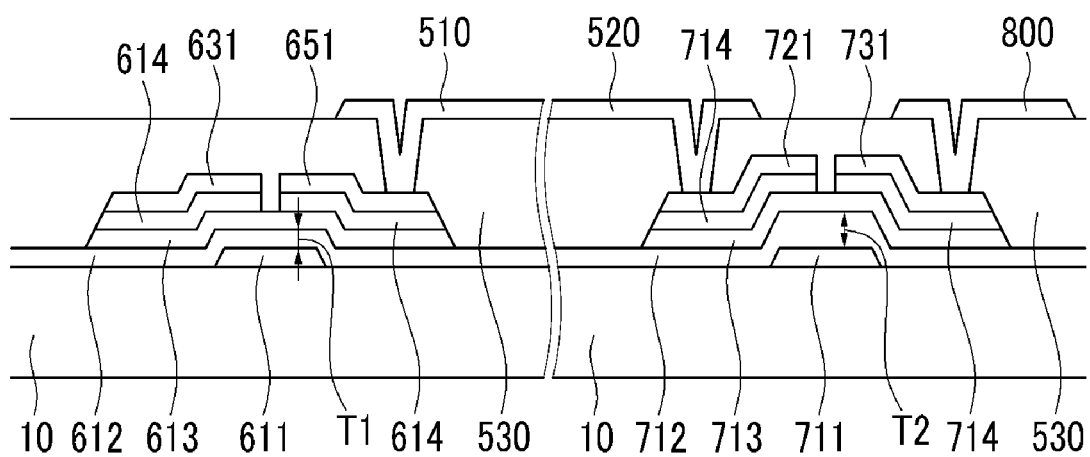
FIG. 14 is a partial cross-sectional view of a thin film transistor substrate for a display device according to yet another alternative exemplary embodiment of the present invention.
Figure 15:
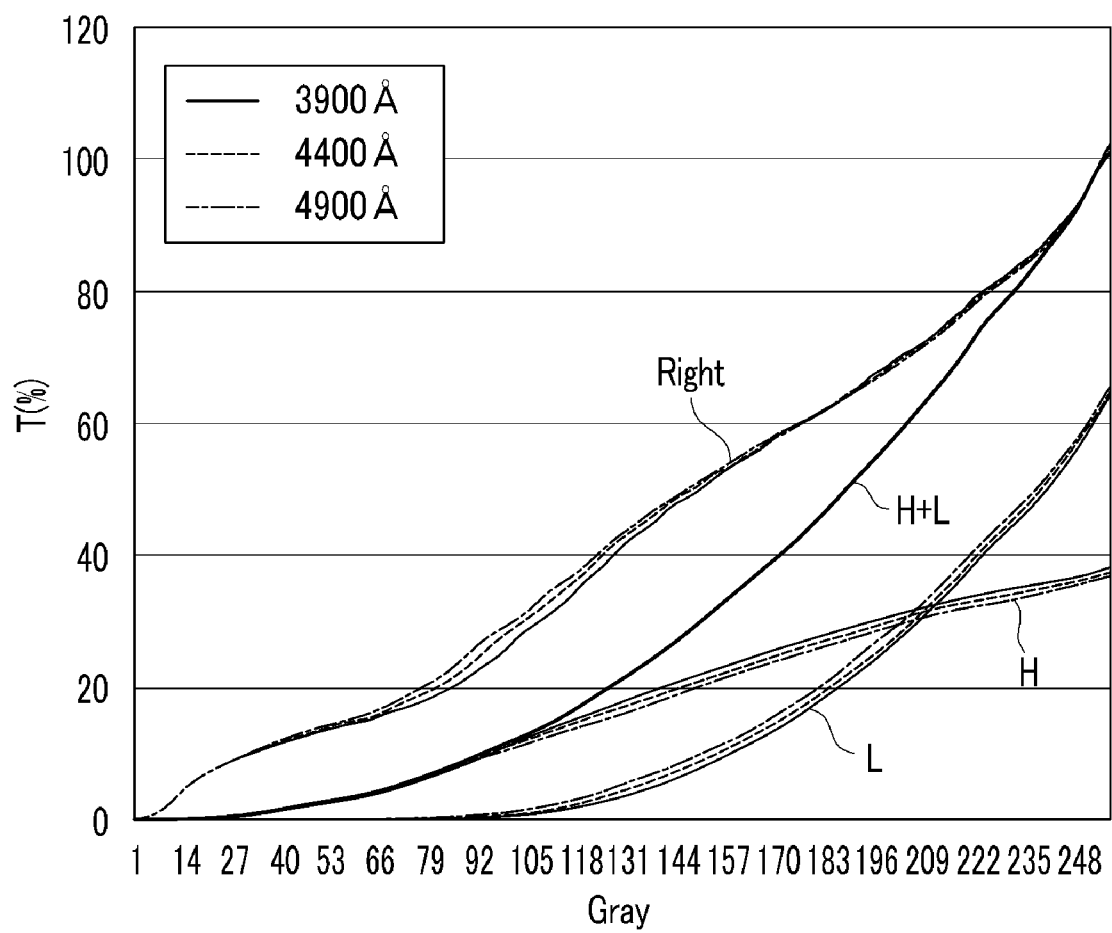
FIG. 15 is a graph of transmittance versus gray level illustrating a change of a gamma curve according to a thickness of a gate insulating layer of the charge control thin film transistor in the display device shown in FIG. 14.

FIG. 14 is a partial cross-sectional view of a thin film transistor substrate for a display device according to still another alternative exemplary embodiment of the present invention, and FIG. 15 is a graph of transmittance versus gray level illustrating a change of a gamma curve according to a thickness of a gate insulating layer of the charge control thin film transistor in the display device shown in FIG. 14.

In another alternative exemplary embodiment for controlling the gamma characteristic of the low voltage sub-pixel, a thickness of a gate insulating layer of a charge control thin film transistor is different from a thickness of a gate insulating layer of a thin film transistor for switching the data signals, as will be described in further detail below. More specifically, the gate insulating layer of the charge control thin film transistor may be thicker or, alternatively, thinner than the gate insulating layer of the thin film transistor for switching the data signals. Hereinafter, a case in which the gate insulating layer of the charge control thin film transistor is thicker than the gate insulating layer of the thin film transistor for switching the data signals will be described, but it will be noted that alternative exemplary embodiments are not limited thereto. In addition, the same or like components in the alternative exemplary embodiments respectively shown FIGS. 1-4 and 14 have herein been labeled with the same reference characters, and, accordingly, any repetitive detailed description thereof will be omitted.

Referring to FIGS. 1-4 and 14, a thin film transistor for switching the data signals, e.g., the first TFT 601 (FIGS. 1-4) includes a gate electrode 611, a gate insulating layer 612, an active layer 613, e.g., a semiconductor 613, an ohmic contact layer 614, a source electrode 631 and a drain electrode 651. In addition, a charge control transistor 701, e.g., a charge control thin film transistor 701, includes a gate electrode 711, a gate insulating layer 712, an active layer 713, e.g., a semiconductor 713, an ohmic contact layer 714, a source terminal 721, e.g., a source electrode 721, and a drain terminal 731, e.g., a drain electrode 731. A passivation layer 530 is disposed on the source electrodes 631 and 721, the drain electrodes 651 and 731, and a charge control electrode 800, and first and second pixel electrodes 510 and 520, respectively, are disposed on the passivation layer 530.

In an exemplary embodiment, a thickness T2 of the gate insulating layer 712 of the charge control thin film transistor is greater than a thickness T1 of the gate insulating layer 612 of the thin film transistor for switching the data signals, as shown in FIG. 14. More specifically, in an exemplary embodiment, the thickness T2 of the gate insulating layer 712 of the charge control thin film transistor is greater than the thickness T1 of the gate insulating layer 612 of the thin film transistor for switching the data signals by about 1000 angstroms (Å). To form the gate insulating layers 612 and 712 having the different thicknesses, the gate insulating layer may be partially etched for a relatively thin thickness, or, alternatively, two insulating layers having different etching characteristics may be sequentially deposited, and an upper layer thereof may be selectively etched and removed.

As described in greater detail above, when the gate insulating layers 612 and 712 have different thicknesses, switching characteristics of the thin film transistors associated therewith are changed, such that gamma characteristics of a low voltage sub-pixel are effectively controlled, as will now be described in further detail with reference to FIG. 15.

In FIG. 15, a solid line ("———") indicates a first case in which the gate insulating layer of the charge control thin film transistor is formed with a thickness of 3900 Å, a dotted line ("-------") indicates a second case in which the thickness is 4400 Å, and the one-point chain line ("-·-·-") indicates a third case I which the thickness is 4900 Å. For each of the three abovementioned cases, a thickness of the gate insulating layer of the thin film transistor for switching the data signal was fixed at 3900 Å. In addition, in FIG. 15, curve "L" indicates a gamma curve that is measured at a front portion of a display device for a low voltage sub-pixel including two sub-pixels, curve "H" indicates a gamma curve that is measured at the front for a high voltage sub-pixel including two sub-pixels, and curve "H+L" indicates a gamma curve representing a combination of the curve "H" and curve "L." Curve "Right" indicates a gamma curve of two sub-pixels disposed at a right side of the display device.

When the thickness of the gate insulating layer of the charge control thin film transistor is changed from 3900 Å to 4400 Å and to 4900 Å, a voltage ratio between the high voltage sub-pixel and the low voltage sub-pixel is changed from 1:0.693 to 1:0.712 and to 1:0.729, respectively, and the associated gamma curves change as shown in FIG. 15. Thus, it is confirmed that the gamma curve of the low voltage sub-pixel and the gamma curve of the right side increase as the thickness of the gate insulating layer of the charge control thin film transistor is increased. Accordingly, gamma characteristics of a display device according to an exemplary embodiment are effectively controlled by controlling the thickness of the gate insulating layer of the charge control thin film transistor.

As described in greater detail above, exemplary embodiments in which a duration time of the turn-on voltage pulse of the charge control thin film transistor and the magnitude of the turn-on voltage are controlled, or, alternatively, the thickness of the gate insulating layer of the charge control thin film transistor is controlled, substantially reduce and or effectively remove deteriorations of a display quality, such as the reddish color of images inclined in the red, and the exemplary embodiments may be widely applied to liquid crystal displays using the charge-down capacitor, regardless of a shape of the pixel PX. For example, FIG. 16 is a plan view of a liquid crystal panel assembly according to an exemplary embodiment of the present invention, and FIGS. 17 and 18 are partial cross-sectional views taken along lines VI-VI and VII-VII, respectively, of FIG. 16.

Figure 16:
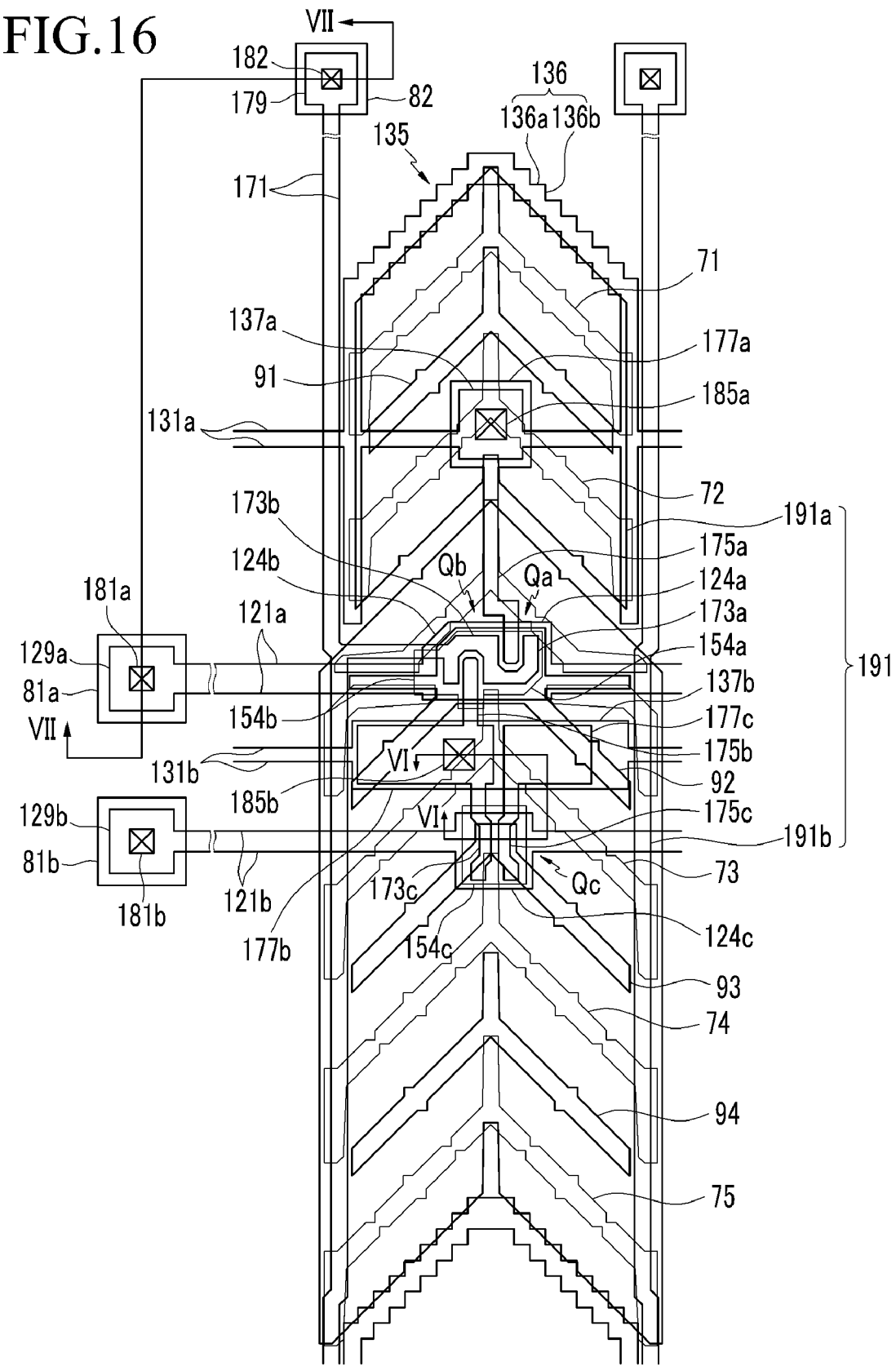
FIG. 16 is a plan view of a liquid crystal panel assembly according to still another alternative exemplary embodiment of the present invention.
Figure 17:
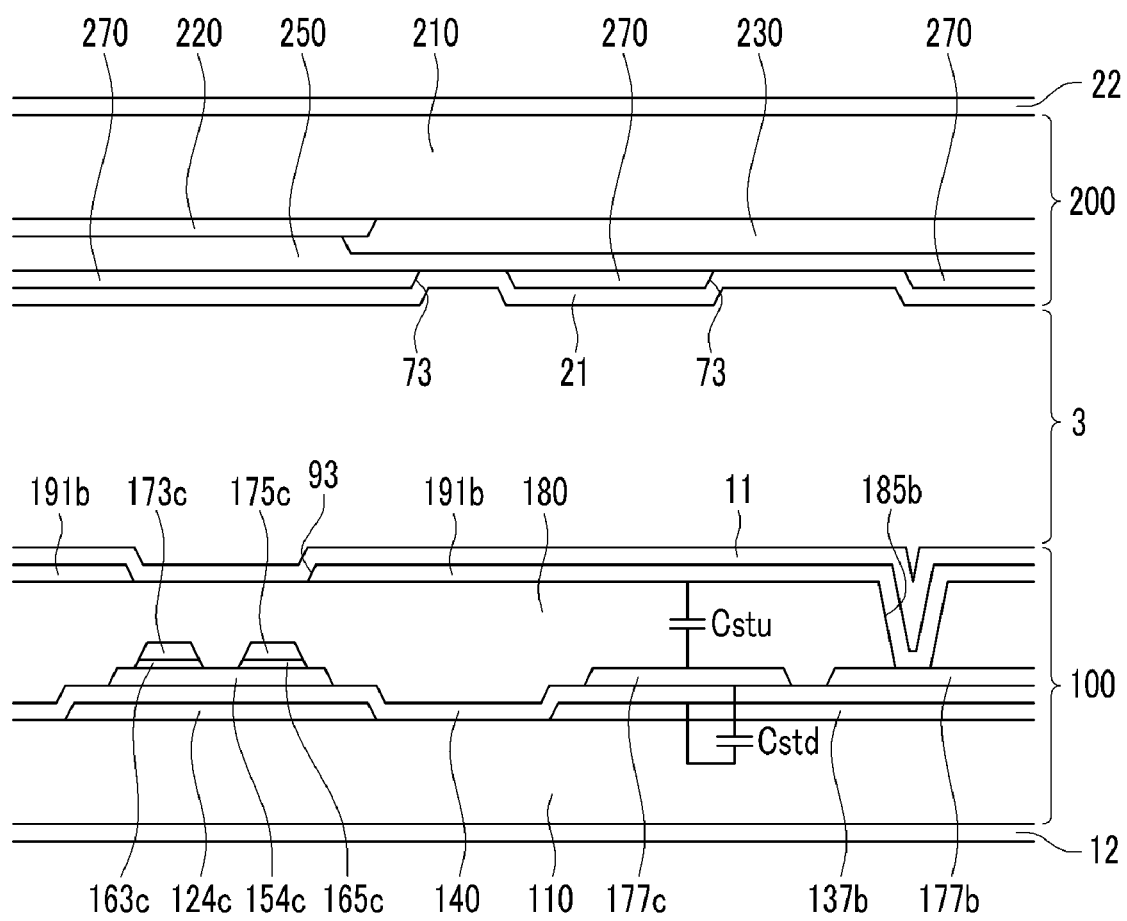
FIGS. 17 and 18 are partial cross-sectional views taken along lines VI-VI and VII-VII, respectively, of FIG. 16.
Figure 18:
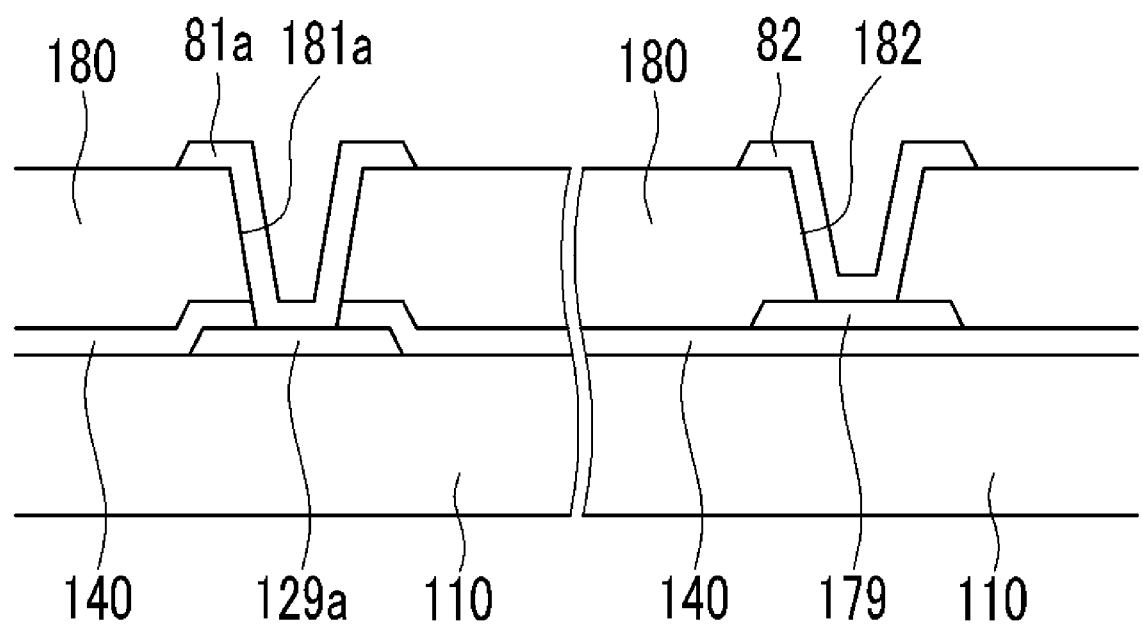

Referring to FIGS. 16-18, a liquid crystal display according to an exemplary embodiment includes a lower display panel 100 and upper display panel 200, a liquid crystal layer 3 interposed between the lower display panel 100 and the upper display panel 200, and polarizers 12 and 22 attached to outer surfaces of the lower display panel 100 and the upper display panel 200, respectively.

The lower display panel 100 will now be described in further detail with reference to FIGS. 16-18.

A plurality of gate conductors, including a plurality of pairs of first gate lines 121a and second gate lines 121b, as well as a plurality of pairs of first storage electrode lines 131a and second storage electrode lines 131b are disposed on an insulation substrate 110. First gate lines 121a of the plurality of first gate lines 121a include a first gate electrode 124a and a second gate electrode 24b, and an end portion 129a, while the second gate line 121b has a third gate electrode 124c and an end portion 129b.

The first storage electrode line 131a includes a first storage electrode 137a protruding upward and downward (as viewed in FIG. 16), and a stem line portion extending substantially parallel to the first gate line 121a and the second gate line 121b. Furthermore, the first storage electrode line 131a includes a light interception member 135 extending from the stem line portion and obliquely angled with respect to the first gate line 121a and the second gate line 121b.

The second storage electrode line 131b includes a second storage electrode 137b protruding upward and downward (as viewed in FIG. 16).

A gate insulating layer 140 is disposed on the gate conductors 121a, 121b, 131a, and 131b. First, second and third semiconductor islands 154a, 154b and 154c, respectively, are disposed on the gate insulating layer 140, and are overlaid with a plurality of first ohmic contacts (not shown), second ohmic contacts (not shown), and third ohmic contacts 163c and 165c.

Data conductors including a plurality of data lines 171 and a plurality of first, second, and third drain electrodes 175a, 175b and 175c, respectively, are disposed on the ohmic contacts and the gate insulating layer 140.

Each data line 171 has a plurality of first source electrodes 173a and second source electrodes 173b, and a wide end portion 179 connected to other layers and/or to external driving circuits (not shown).

First to third drain electrodes 175a, 175b and 175c, respectively, have wide end portions 177a, 177b and 177c, respectively, disposed at a side thereof, and bar-shaped end portions at another side thereof The wide end portions 177a and 177b of the first drain electrode 175a and the second drain electrode 175b, respectively, are overlapped with the first storage electrode 137a and the second storage electrode 137b, respectively, and the bar-shaped end portions thereof are partially surrounded by the first source electrode 173a and the second source electrode 173b, respectively. The wide end portion 177b of the second drain electrode 175b extends therefrom to form a third source electrode 173c, which in an exemplary embodiment is a bar-shaped third source electrode 173c. In other words, the second drain electrode 175b and the third source electrode 173c may be integrally formed. The wide end portion 177c of the third drain electrode 175c is overlapped with the second storage electrode 137b, and the bar-shaped end portion thereof faces the third source electrode 173c.

The first, second, and third gate electrodes 124a, 124b and 124c, respectively, the first, second and third source electrodes 173a, 173b, and 173c, respectively, and the first, second and third drain electrodes 175a, 175b, and 175c, respectively, form first, second, and third thin film transistors ("TFTs") Qa, Qb and Qc, respectively, together with the first, second and third semiconductor islands 154a, 154b and 154c, respectively, and channels of the first, second and third thin film transistors Qa, Qb and Qc, respectively, are formed in the semiconductors 154a, 154b and 154c, respectively, between the source electrodes 173a, 173b and 173c, respectively, and the drain electrodes 175a, 175b and 175c, respectively.

A passivation layer 180 is disposed on data conductors 171, 175a, 175b and 175c and exposed portions of the semiconductors 154a, 154b and 154c.

The passivation layer 180 has a plurality of contact holes 182, 185a and 185b exposing the end of portion 179 of the data line 171, the wide end portion 177a of the first drain electrode 175a and the wide end portion 177b of the second drain electrode 175b, respectively. The passivation layer 180 and the gate insulating layer 140 commonly include a plurality of contact holes 181a and 181b exposing the end portions 129a and 129b, respectively, of the first gate line 121a and the second gate line 121b, respectively.

A pixel electrode 191, which includes a first sub-pixel electrode 191a and a second sub-pixel electrode 191b, and a plurality of contact assistants 81a, 81b and 82, are disposed on the passivation layer 180.

The first sub-pixel electrode 191a includes a pair of substantially vertical edges facing each other, and two pairs of first to fourth oblique edges adjacent to the pair of substantially vertical edges. The second sub-pixel electrode 191b also includes a pair of substantially vertical edges facing each other, and two pairs of first to fourth oblique edges adjacent to the substantially vertical edges. The respective vertical edges are substantially parallel to the data line 171, and the respective oblique edges are obliquely angled with respect to the vertical edges at about 45° or about 135°. Thus, first and second oblique edges meet each other at right angles, and third and fourth oblique edges meet each other at right angles.

The first sub-pixel electrode 191a and the second sub-pixel electrode 191b are adjacent to each other and aligned along a column direction, and the first sub-pixel electrode 191a is smaller in height than the second sub-pixel electrode 191b.

The first sub-pixel electrode 191a includes a cutout 91, and the second sub-pixel electrode 191b includes cutouts 92, 93 and 94.

The cutouts 91, 92, 93 and 94 of the first sub-pixel electrode 191a and the second sub-pixel electrode 191b are angled with respect to the first gate line 121a and the second gate line 121b at about 45°, as shown in FIG. 16. Thus, the pixel electrode 191 according to an exemplary embodiment is partitioned into a plurality of domains by the cutouts 91, 92, 93 and 94. In an alternative exemplary embodiment, a number of domains and/or the cutouts may be altered depending upon design factors such as pixel size, length ratio of the horizontal edge of the pixel electrode to the vertical edge thereof, as well as a type or characteristics of the liquid crystal layer 3, for example.

The first sub-pixel electrode 191a and the second sub-pixel electrode 191b are connected to the first drain electrode 175a and the second drain electrode 175b, respectively, through the contact holes 185a and 185b, respectively, to receive data voltages therefrom. Furthermore, the second sub-pixel electrode 191b is connected to the third source electrode 173c through the contact hole 185b. As the second sub-pixel electrode 191b is connected to the second drain electrode 175b and the third source electrode 173c through the second contact hole 185b, only two contact holes 185a and 185b are required per pixel PX. Accordingly, a aperture ratio is substantially enhanced as compared to a case in which the second sub-pixel electrode 191b is connected to the second drain electrode 175b and the third source electrode 173c, respectively, through two different contact holes.

The first sub-pixel electrode 191a and the second sub-pixel electrode 191b, together with the common electrode 270 of the common electrode display panel 200, generate electric fields, thereby determining alignment directions of liquid crystal molecules of the liquid crystal layer 3 disposed between the pixel electrode 191 and the common electrode 270. A polarization of light passing through the liquid crystal layer 3 is thereby controlled depending upon the alignment directions of the liquid crystal molecules. The pixel electrode 191 and the common electrode 270 form a liquid crystal capacitor to store voltages applied thereto even after the thin film transistors turn off.

The first sub-pixel electrode 191a and the second sub-pixel electrode 191b are overlapped with the first storage electrode line 131a and the second storage electrode line 131b including the first and second storage electrodes 137a and 137b. The pixel electrode 191 is overlapped with the first storage electrode line 131a and the second storage electrode line 131b to form storage capacitors, which improve a voltage storage capacity of the liquid crystal capacitors.

The second storage electrode 137b and the wide end portion 177c of the third drain electrode 175c overlap each other and include the gate insulating layer 140 disposed therebetween to form a step-down capacitor Cstd (FIG. 17). Likewise, the wide end portion 177c of the third drain electrode 175c and the second sub-pixel electrode 191b overlapped each other and include the passivation layer 180 disposed therebetween to form a step-up capacitor Cstu (FIG. 17). In an exemplary embodiment, the passivation layer 180 is thicker than the gate insulating layer 140, and the step-down capacitor Cstd therefore has a greater capacitance than a capacitance of the step-up capacitor Cstu.

As described in greater detail above, in a liquid crystal display according to an exemplary embodiment, the step-down capacitor Cstd and the step-up capacitor Cstu are formed using the second storage electrode 137b, e.g., are formed without requiring or providing a separate storage electrode, and an aperture ratio is thereby substantially enhanced as compared to a case in which a separate storage electrode is required to form the step-down capacitor Cstd and/or the step-up capacitor Cstu.

Still referring to FIGS. 16-18, the contact assistants 81a and 81b are connected to the end portions 129a and 129b of the first gate line 121a and the second gate line 121b, respectively, through the contact holes 181a and 181b, respectively. The contact assistant 82 is connected to the end portion 179 of the data line 171 through the contact hole 182. The contact assistants 81a, 81b and 82 protect and assist an adhesion property of the end portions 129a and 129b of the first gate line 121a and the second gate line 121b and the end portion 179 of the data line 171 to an external device or devices (not shown).

An alignment layer 11 is disposed on the pixel electrode 191, the contact assistants 81a, 81b and 82, and the passivation layer 180.

The upper display panel 200 will now be described in greater detail with reference to FIGS. 16-18.

A light blocking member 220 is disposed on an insulation substrate 210. The light blocking member 220, which in an exemplary embodiment is a black matrix 220, effectively prevents leakage of light through the upper display panel 200.

Color filters 230 are disposed on the insulation substrate 210. The color filters 230 are disposed substantially within a area surrounded by the light blocking member 220, and may extend substantially longitudinally along columns of the pixel electrodes 191 in a vertical direction (as viewed in FIG. 16). The color filters 230 may correspond to primary colors, e.g., red, green and blue.

An overcoat 250 is disposed on the color filters 230 and the light blocking member 220.

The common electrode 270 is disposed on the overcoat 250. Cutouts 71, 72, 73, 73, 74 and 75 are formed in the common electrode 270. The cutouts 71 to 75 have at least one oblique portion aligned substantially parallel to the cutouts 91 to 94 of the pixel electrode 191. Triangle-shaped notches are formed at oblique portions of the cutouts 71 to 75.

Alignment layers 11 and 21 are disposed on inner surfaces of the upper display panel 100 and the lower display panel 200, respectively.

In an exemplary embodiment, the liquid crystal layer 3 has negative dielectric anisotropy, and the liquid crystal molecules of the liquid crystal layer 3 are aligned such that directors thereof are aligned substantially vertical to a surface of the first display panel 100 and the second display panel 200 (as viewed in cross-section in FIG. 17).

When the liquid crystal capacitors corresponding to the first sub-pixel electrode 191a and the second sub-pixel electrode 191b are charged, a generated electric field is aligned substantially vertical to the surface of the first display panel 100 and the second display panel 200. In response to the electric field, the liquid crystal molecules are inclined to be oriented such that the directors thereof stand substantially vertical to, e.g., substantially parallel to, the direction of the electric field.

The cutouts 91 to 94 and 71 to 75 of the pixel electrode 191 and the common electrode 270, and the oblique edges of the pixel electrode 191 aligned substantially parallel thereto, deform the electric fields. More particularly, the abovementioned cutouts form horizontal components for affecting the inclination direction of the liquid crystal molecules. The horizontal components of the electric field are aligned substantially vertical to the oblique edges of the cutouts 91 to 94 and 71 to 75, and the oblique edges of the pixel electrode 191.

Thus, the cutouts 71 to 75 and the cutouts 91 to 94 partition the pixel electrode 191 into domains, each of which has two major edges obliquely angled with respect to longitudinal edges, e.g., major edges, of the pixel electrode 191. The liquid crystal molecules in respective domains are inclined in a direction substantially vertical to the major edges of the pixel electrode 191, and hence, approximately four inclination directions are formed. As a result, a reference viewing angle of the liquid crystal display according to an exemplary embodiment is substantially improved, e.g., is significantly widened.

A light interception member 135 is disposed along the first and second oblique edges of the first sub-pixel electrode 191a, and the third and fourth oblique edges of the second sub-pixel electrode 191b. The light interception member 135 includes steps 136 with horizontal and vertical portions 136a and 136b, respectively. More particularly the horizontal portion 136a is substantially parallel to the first gate line 121a and the second gate line 121b, and the vertical portion 136b is substantially parallel to the data line 171. Polarization axes of the polarizers 12 and 22 are angled, with respect to the oblique edges, at about 45° or about 135°, and leakage of light is substantially reduced and/or is effectively prevented near the oblique edges. Thus, in an exemplary embodiment, the light interception member 135, which includes the steps 136 each including horizontal and vertical portions 136a and 136b, respectively, aligned substantially parallel to the polarization axis of the polarizers 12 and 22, is disposed at the first and second oblique edges of the first sub-pixel electrode 191a and the third and fourth oblique edges of the second sub-pixel electrode 191b, leakage of light at an area of the pixel electrode 191 is effectively prevented.

In an exemplary embodiment, the horizontal and vertical portions 136a and 136b, respectively, of the step 136 may have a same length. More specifically, the horizontal and vertical portions 136a and 136b, respectively, may have a length from about 8 μm to about 12 μm, but alternative exemplary embodiments are not limited thereto. The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display device, comprising:
   gate lines extending along a first direction;
   data lines extending along a second direction and intersecting the gate lines;
   charge control lines extending along the first direction and each including a charge control voltage input pad disposed at an end thereof;
   a first thin film transistor and a second thin film transistor each including a control electrode and an input electrode connected to one of the gate lines and one of the data lines, respectively;
   a first liquid crystal capacitor connected to an output electrode of the first thin film transistor;
   a second liquid crystal capacitor connected to an output electrode of the second thin film transistor;
   wherein a charge control thin film transistor including a control electrode and an input electrode connected to one of the charge control lines and the second liquid crystal capacitor respectively; and
   a charge-down capacitor connected to an output electrode of the charge control thin film transistor,
   wherein a duration time of a turn-on voltage pulse applied to the charge control thin film transistor is different from a duration time of a turn-on voltage pulse applied to at least one of the first thin film transistor and the second thin film transistor.

2. The display device of claim 1, wherein
   the duration time of the turn-on voltage pulse applied to the charge control thin film transistor is less than the duration time of the turn-on voltage pulse applied to the at least one of the first thin film transistor and the second thin film transistor.

3. The display device of claim 2, further comprising
   pixels arranged in a matrix including pixel rows,
   wherein the pixels include the first liquid crystal capacitor, the second liquid crystal capacitor, the charge-down capacitor, the first thin film transistor, the second thin film transistor and the charge control thin film transistor,
   the data lines include a first data line and a second data line,
   the gate lines include a first gate line connected to the pixels of an odd-numbered pixel row and a second gate line connected to the pixels of an even-numbered pixel row, and
   the first gate line and the second gate line are supplied with a same gate voltage.

4. The display device of claim 3, wherein
   the pixels of the odd-numbered pixel row are connected to one data line of the first data line and the second data line, and
   the pixels of the even-numbered unit pixel row are connected to another data line of the first data line and the second data line not connected to the pixels of the odd-numbered pixel row.

5. The display device of claim 4, wherein
   the charge control lines include a first charge control line connected to the pixels of the odd-numbered pixel row and a second charge control line connected to the pixels of the even-numbered pixel row, and
   the first charge control line and the second charge control line are supplied with a same charge control turn-on voltage.

6. The display device of claim 5, further comprising
   a storage electrode line extending along the first direction,
   wherein the storage electrode line includes a protrusion overlapping at least a portion of a charge control electrode of the charge down capacitor.

7. The display device of claim 1, further comprising
   a signal controller which applies a first clock signal for generating the turn-on voltage pulse applied to the charge control thin film transistor,
   wherein the first clock signal is different from a second clock signal for generating the turn-on voltage pulse applied to the first thin film transistor and the second thin film transistor.

8. A display device comprising:
   gate lines extending along a first direction;
   data lines extending along a second direction and intersecting the gate lines;
   charge control lines extending along the first direction and each including a charge control voltage input pad disposed at an end thereof;

a first thin film transistor and a second thin film transistor each including a control electrode and an input electrode connected to one of the gate lines and one of the data lines, respectively;

a first liquid crystal capacitor connected to an output electrode of the first thin film transistor;

a second liquid crystal capacitor connected to an output electrode of the second thin film transistor;

wherein a charge control this film transistor including a control electrode and an input electrode connected to one of the charge control lines and the second liquid crystal capacitor respectively; and a charge-down capacitor connected to an output electrode of the charge control thin film transistor, wherein a magnitude of a turn-on voltage applied to the charge control thin film transistor is different from a magnitude of a turn-on voltage applied to at least one of the first thin film transistor and the second thin film transistor.

9. The display device of claim 8, wherein
the magnitude of the turn-on voltage applied to the charge control thin film transistor is less than the magnitude of the turn-on voltage applied to the at least one of the first thin film transistor and the second thin film transistor.

10. The display device of claim 9, further comprising
pixels arranged in a matrix including pixel rows,
wherein the pixels include the first liquid crystal capacitor, the second liquid crystal capacitor, the charge-down capacitor, the first thin film transistor, the second thin film transistor and the charge control thin film transistor,
the data lines include a first data line and a second data line,
the gate lines include a first gate line connected to the pixels of an odd-numbered pixel row and a second gate line connected to the pixels of an even-numbered pixel row, and
the first gate line and the second gate line are supplied with a same gate voltage.

11. The display device of claim 10, wherein
the pixels of the odd-numbered pixel row are connected to one data line of the first data line and the second data line, and
the pixels of the even-numbered unit pixel row are connected to another data line of the first data line and the second data line not connected to the pixels of the odd-numbered pixel row.

12. The display device of claim 11, wherein
the charge control lines include a first charge control line connected to the pixels of the odd-numbered pixel row and a second charge control line connected to the pixels of the even-numbered pixel row, and
the first charge control line and the second charge control line are applied with a same charge control turn-on voltage.

13. The display device of claim 12, further comprising
a storage electrode line extending along the first direction,
wherein the storage electrode line includes a protrusion overlapping at least a portion of a charge control electrode of the charge down capacitor.

14. The display device of claim 8, wherein
the turn-on voltage applied to the charge control thin film transistor is generated by dividing the turn-on voltage applied to the at least one of the first thin film transistor and the second thin film transistor.

15. A display device comprising:
gate lines extending along a first direction;
data lines extending along a second direction and intersecting the gate lines;
charge control lines extending along the first direction and each including a charge control voltage input pad disposed at an end thereof;

a first thin film transistor and a second thin film transistor each including a control electrode and an input electrode connected to one of the gate lines and one of the data lines, respectively;

a first liquid crystal capacitor connected to an output electrode of the first thin film transistor;

a second liquid crystal capacitor connected to an output electrode of the second thin film transistor;

a charge control thin film transistor including a control electrode and an input electrode connected to one of the charge control lines and the second liquid crystal capacitor respectively; and a charge-down capacitor connected to an output electrode of the charge control thin film transistor, wherein a thickness of an insulating layer disposed between the control electrode and a semiconductor of the charge control thin film transistor is different from a thickness of an insulating layer disposed between the control electrode and a semiconductor of at least one of the first thin film transistor and the second thin film transistor.

16. The display device of claim 15, wherein
the thickness of the insulating layer disposed between the control electrode and the semiconductor of the charge control thin film transistor is greater than the thickness of the insulating layer between the control electrode and the semiconductor of the first thin film transistor and the second thin film transistor by a value greater than or equal to about 1000 angstroms.

17. The display device of claim 16, further comprising
pixels arranged in a matrix including pixel rows,
wherein the pixels include the first liquid crystal capacitor, the second liquid crystal capacitor, the charge-down capacitor, the first thin film transistor, the second thin film transistor and the charge control thin film transistor,
the data lines include a first data line and a second data line,
the gate lines include a first gate line connected to the pixels of an odd-numbered pixel row and a second gate line connected to the pixels of an even-numbered pixel row, and
the first gate line and the second gate line are supplied with a same gate voltage.

18. The display device of claim 17, wherein
the pixels of the odd-numbered pixel row are connected to one data line of the first data line and the second data line, and
the pixels of the even-numbered unit pixel row are connected to another data line of the first data line and the second data line not connected to the pixels of the odd-numbered pixel row.

19. The display device of claim 18, wherein
the charge control lines include a first charge control line connected to the pixels of the odd-numbered pixel row and a second charge control line connected to the pixels of the even-numbered pixel row, and
the first charge control line and the second charge control line are supplied with a same charge control turn-on voltage.

20. The display device of claim 19, further comprising
a storage electrode line extending along the first direction,
wherein the storage electrode line includes a protrusion overlapping at least a portion of a charge control electrode of the charge down capacitor.

* * * * *